United States Patent
Morini et al.

(10) Patent No.: US 10,587,262 B1
(45) Date of Patent: Mar. 10, 2020

(54) DV/DT SELF-ADJUSTMENT GATE DRIVER ARCHITECTURE

(71) Applicant: Infineon Technologies Austria AG, Villach (AT)

(72) Inventors: Sergio Morini, Pavia (IT); Martina Arosio, Pavia (IT); Karl Norling, Villach (AT)

(73) Assignee: Infineon Technologies Austria AG (AT)

( * ) Notice: Subject to any disclaimer, the term of this patent is extended or adjusted under 35 U.S.C. 154(b) by 0 days.

(21) Appl. No.: 16/290,158

(22) Filed: Mar. 1, 2019

(51) Int. Cl.
*H02M 3/156* (2006.01)
*H03K 17/687* (2006.01)
*H03K 17/16* (2006.01)

(52) U.S. Cl.
CPC ......... *H03K 17/687* (2013.01); *H03K 17/165* (2013.01)

(58) Field of Classification Search
CPC ............. H03K 17/6872; H03K 17/687; H03K 17/162; H03K 17/165; H03K 17/73; H03K 17/732; H03K 17/0814; H03K 17/08142; H03K 17/082; H03K 17/0822; H03K 17/826; H03K 17/10; H03K 17/102; H03K 17/12; H03K 17/122; H03K 17/0412; H03K 17/04123; H03K 17/04126

See application file for complete search history.

(56) References Cited

U.S. PATENT DOCUMENTS

| 7,274,161 B2 * | 9/2007 | Mori ........................ H02P 6/20 318/400.25 |
| 8,729,881 B2 * | 5/2014 | Chang ................. H02M 3/1588 323/284 |
| 9,301,278 B2 * | 3/2016 | Hasegawa ............. H04W 48/04 |
| 9,374,081 B2 | 6/2016 | Janschitz et al. |

FOREIGN PATENT DOCUMENTS

DE    102016111449 A1    12/2017

OTHER PUBLICATIONS

Yanick Lobsiger, et al.—"Closed-Loop di/dt and dv/dt IGBT Gate Driver." IEEE Transactions on Power Electronics, Jun. 2015, vol. 30, No. 6, pp. 3402-3417.

* cited by examiner

*Primary Examiner* — An T Luu
(74) *Attorney, Agent, or Firm* — Design IP

(57) ABSTRACT

A gate driver circuit includes a gate driver and a sensing circuit. The gate driver is configured to generate an on-current during a plurality of turn-on switching events to drive a transistor, where a voltage across the transistor changes from a first value to a second value with a slope during the plurality of turn-on switching events, where the slope is of either an active type dependent on an amplitude of the on-current or a passive type. The sensing circuit determines whether the slope during a first turn-on switching event is the active type or the passive type, and regulates the amplitude of the on-current during a second turn-on switching event that is subsequent to the first turn-on switching event if the slope is the active type and to maintain the amplitude of the on-current as unchanged during the second turn-on switching event if the slope is the passive type.

22 Claims, 13 Drawing Sheets

DV/DT SELF-ADJUSTMENT GATE DRIVER ARCHITECTURE

FIELD

The present disclosure relates generally to driving techniques in gate drivers, and, in particular, to regulating a voltage change rate of a transistor driven by a gate driver.

BACKGROUND

New generation of Insulated Gate Bipolar Transistors (IGBTs) and Metal Oxide Semiconductor Field Effect Transistors (MOSFETs) power switches (both Superjunction and wide band gap ones) are characterized by a gate-drain capacitance ($C_{GD}$) which is extremely non-linear along the drain-source voltage $V_{DS}$ range. Especially in superjunction technology, the gate-drain capacitance $C_{GD}$ has a large variation due to voltage. This capacitance is fundamental for the switching speed transients.

In a hard switching application, the power switch is turned on when $V_{DS}$ is high, or in other words hard switching occurs when there is an overlap between high voltage $V_{DS}$ and high current IDS during a switching event (e.g., during a turn on switching event) of the power transistor. This overlap causes energy losses which can be minimized by increasing di/dt and dV/dt (i.e., the slope of current IDS and the slope of voltage $V_{DS}$. Thus, a very steep $V_{DS}$ voltage transient, called dV/dt, may be present.

In standard planar technology, the fast dV/dt transient is present but is mitigated by the miller multiplication effect on $C_{GD}$. In fact, a gate diver output current Io+, used to raise (i.e., charge) the gate voltage of the power transistor during the turn on transient, fully flows into $C_{GD}$ during the dV/dt and the gate voltage appears flat forming the "miller plateau." If the speed of dV/dt doubles, the capacitance $C_{GD}$ doubles its apparent value and the system self-regulates.

For this reason, when using power switching devices, the output switching starts with a very high dV/dt (when $V_{DS}$ voltage is high) and it finishes with a long slow tail in the last few volts (when $C_{GD}$ becomes large). FIG. 1 illustrates, on the left, a dV/dt behavior in power switches, and, on the right, a schematic representation of an IGBT 1. In particular, FIG. 1 shows, on the left, a transient diagram of $V_{DS}$ (i.e., dV/dt) and IDS (i.e, di/dt) during a turn on switching event. During the turn on switching event, $V_{GS}$ increases as $C_{GD}$ is charged. Once $V_{GS}$ is equal to the threshold voltage Vth, current IDS begins to flow. FIG. 1 further illustrates, on the right, a schematic diagram of a power transistor 1 showing the parasitic capacitance $C_{GD}$, the drain-source voltage $V_{DS}$, the drain-source current IDS, and the gate-source voltage $V_{GS}$.

As can be seen in the diagram on the left, the $V_{DS}$ voltage transient, called dV/dt, is initially very steep and fast and then changes to finish with a long slow tail for the last few volts. This dynamic behavior is typical of transistor devices, especially in superjunction devices, and both fast and slow dV/dt transients are not wanted for a few of reasons.

First, the transistor switching characteristic is reflected on the motor phase making these power devices not properly acceptable for motor manufacturers because of the hard stress reflected on the motor phase. In particular, the fast dV/dt stresses the motor and in particular the insulator material between the motor windings. Thus, the fast dV/dt transient, can compromise or even damage the insulator material between the motor windings.

Second, steep dV/dt values can generate problems in qualifying the final system from an electromagnetic interference (EMI) and an electromagnetic compatibility (EMC) point of view.

Third, low or slight dV/dt values worsen the switching losses since losses continue as long as the dV/dt tail is above zero.

In summary, when using transistor switches, it becomes difficult to find the correct single value Io+ current to turn on the power transistor since the switching speed appears to be too fast (i.e., fast dV/dt) or too slow (i.e., dV/dt slow tail) in different moments of the same switching event. Furthermore, being a parasitic capacitor, $C_{GD}$ is not controlled in production. This, causes wide lot-to-lot variations on the limit values.

In view of the above, a detection and driving strategy may be desirable in order to reduce this transient in a dV/dt value suitable for motor drive while at the same time limiting the switching losses in the power inverter.

SUMMARY

Embodiments provide a gate driver circuit that includes a gate driver and a sensing circuit. The gate driver is configured to generate an on-current during a plurality of turn-on switching events to drive a transistor, where a voltage across the transistor changes from a first value to a second value with a slope during the plurality of turn-on switching events, where the slope is of either an active type or a passive type, and where the slope of the active type is dependent on an amplitude of the on-current. The sensing circuit is configured to determine whether the slope during a first turn-on switching event is the active type or the passive type, and to regulate the amplitude of the on-current during a second turn-on switching event that is subsequent to the first turn-on switching event if the slope is the active type and to maintain the amplitude of the on-current as unchanged during the second turn-on switching event if the slope is the passive type.

Embodiments provide a gate driver circuit that includes a gate driver and a sensing circuit. The gate driver is configured to generate an on-current during a plurality of turn-on switching events to drive a transistor, where each turn-on switching event of the plurality of turn-on switching events includes a first time interval and a second time interval subsequent to the first time interval. During the plurality of turn-on switching events, a voltage across the transistor changes from a first value to a second value with an initial slope during the first time interval and with a second slope during the second time interval, where the initial slope is greater than the second slope. The initial slope starts during or after a dead time, where the initial slope is dependent on an amplitude of the on-current when starting with or after the dead time, and where the second slope is dependent on the amplitude of the on-current. The sensing circuit is configured to detect an expiration of the first time interval of a first turn-on switching event of the plurality of turn-on switching events, and increase the on-current to a maximum value for at least a portion of the second time interval of the first turn-on switching event in response to the detected expiration of the first time interval.

Embodiments provide a method of driving a transistor. The method includes generating an on-current during a plurality of turn-on switching events to drive the transistor, wherein a voltage across the transistor changes from a first value to a second value with a slope during the plurality of turn-on switching events, where the slope is of either an active type or a passive type, and where the slope of the active type is dependent on an amplitude of the on-current; determining whether the slope during a first turn-on switching event is the active type or the passive type; and regulating the amplitude of the on-current during a second turn-on switching event that is subsequent to the first turn-on switching event if the slope is the active type and to maintain the amplitude of the on-current as unchanged during the second turn-on switching event if the slope is the passive type.

Embodiments provide a method of driving a transistor. The method includes generating an on-current during a plurality of turn-on switching events to drive the transistor, wherein each turn-on switching event of the plurality of turn-on switching events comprises a first time interval and a second time interval subsequent to the first time interval, wherein, during the plurality of turn-on switching events, a voltage across the transistor changes from a first value to a second value with an initial slope during the first time interval and with a second slope during the second time interval, wherein the initial slope is greater than the second slope, wherein the initial slope starts during or after a dead time, wherein the initial slope is dependent on an amplitude of the on-current when starting with or after the dead time, and wherein the second slope is dependent on the amplitude of the on-current; detecting an expiration of the first time interval of a first turn-on switching event of the plurality of turn-on switching events; and increasing the on-current to a maximum value for at least a portion of the second time interval of the first turn-on switching event in response to the detected expiration of the first time interval.

BRIEF DESCRIPTION OF THE DRAWINGS

Embodiments are described herein making reference to the appended drawings.

DETAILED DESCRIPTION

Figure 1:
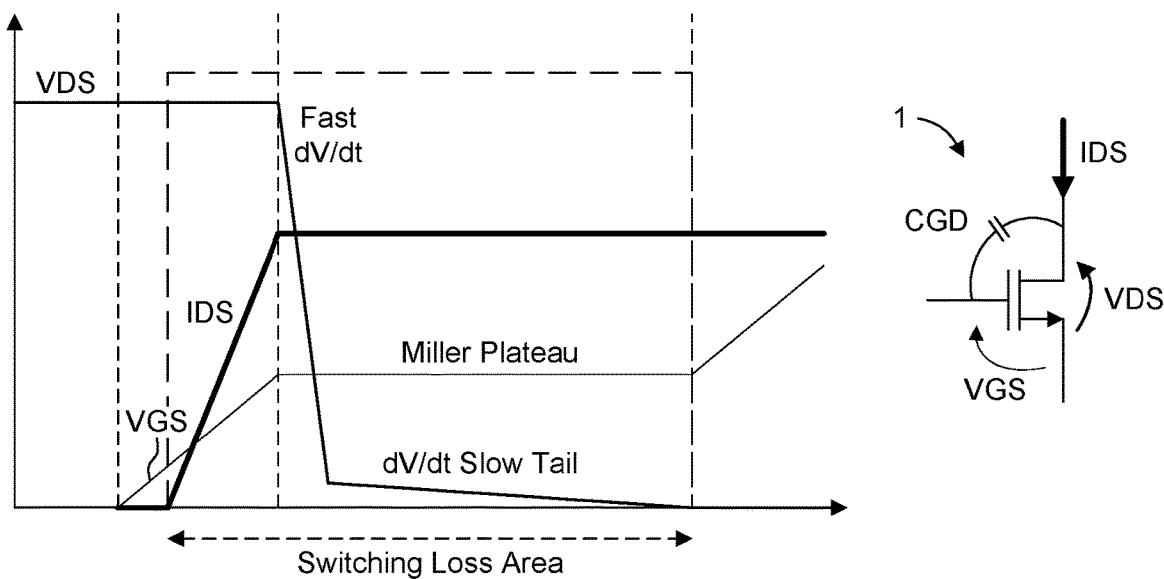
FIG. 1, on the left, illustrates a voltage-circuit diagram of a dV/dt behavior in power switches, and, on the right, a schematic representation of a power switch according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

A sensor may refer to a component which converts a physical quantity to be measured to an electric signal, for example, a current signal or a voltage signal. The physical quantity may, for example, be a current or a voltage at a shunt resistor in a single-shunt resistor system.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate sufficiently to turn off the device. Current Io− is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches 15V.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage $V_{DS}$ may be substituted for the IGBT's collector-emitter voltage $V_{CE}$ in any one of the examples described herein. Thus, any IGBT module may be substituted by a MOSFET module and vice versa.

In a power MOSFET, for example, the gate is insulated by a thin silicon oxide. Therefore, a power MOSFET has capacitances between the gate-drain, gate-source and drain-source terminals.

Ciss is the input capacitance, and is the capacitance obtained by totaling the gate-source capacitance Cgs and the gate-drain capacitance Cgd (Ciss=Cgd+Cgs); it is the capacitance of the MOSFET as a whole, as seen from the input. This capacitance must be driven (charged) in order to cause the MOSFET to operate, and so is a parameter of importance when studying the drivability of an input device or input losses. Qg is the amount of charge necessary to drive (charge) Ciss.

Coss is the output capacitance, obtained by adding the drain-source capacitance Cds and the gate-drain capacitance Cgs (Coss=Cds+Cgd), and is the total capacitance on the output side. If Coss is large, a current arising due to Coss flows at the output even when the gate is turned off.

Crss is the gate-drain capacitance Cgd itself (Crss=Cgd), and is called the feedback capacitance or the reverse transfer capacitance. This parameter greatly affects switching speed. Qgd is the charge amount necessary to drive (charge) Crss.

These capacitances exhibit a dependence on the drain voltage VDS. For example, drain-source voltage VDS impacts the value of Cds and the drain-gate voltage VDG impacts the value of Cgd.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementary to the each other for driving a phase load.

Having both the high-side transistor and the low-side transistor conducting at the same time will result in a short-circuiting the power supply through the bridge. This condition is called "bridge shoot-through" and will likely destroy the bridge. In order to avoid bridge shoot-through, a "dead time" may be added into the control scheme. With this additional time, one switch will be always turned off first and the other will be turned on after dead time is expired. Thus, both switches are momentarily off during the dead time to ensure that both switches are not on at the same time. Providing dead time can on one side avoid bridge shoot-through but on the other side it also has an adverse effect to be described below.

As noted above, in reference to FIG. 1, the $V_{DS}$ voltage transient, called dV/dt, is initially very steep and fast and then, when $C_{GD}$ becomes large, changes to having a shallow slope to finish with a long slow tail for the last few volts. This dynamic behavior is typical of transistor devices, and both fast and slow dV/dt transients are not wanted.

The fast dV/dt transient may be referred to as a first or an initial dV/dt transient of a turn-on switching event and the slow dV/dt transient may be referred to as a second or a subsequent dV/dt transient of the turn-on switching event, where the slope of the fast dV/dt transient is substantially steeper than the slope of the slow dV/dt transient and the duration of the fast dV/dt is substantially shorter than the duration of the slow dV/dt transient. As an example, the voltage slope dV/dt during the initial, fast portion may have a slope of 50 volt per nanosecond, whereas voltage slope dV/dt during the slow tail portion may be 50 volt per microsecond, which is 1000 times slower than the fast dV/dt portion. The change in slope may be detected by the sensing circuit described herein in order to detect an end of the initial, fast portion and the start of the slow tail portion.

Thus, according to one or more embodiments provided herein, the values for the turn ON current Io+ can be adjusted for a high-side power transistor via the high voltage (HV) gate driver, also referred to as a high-side gate driver. Similarly, the turn ON current Io+ can be adjusted for a low-side power transistor via a low voltage (LV) gate driver, also referred to as a low-side gate driver. The current Io+ may be set and/or adjusted during an occurring turn-on switching event to cut the slow tail portion of dV/dt, and may be set and/or adjusted for a next turn-on switching event for regulating the fast (steep) portion of dV/dt.

Figure 2:
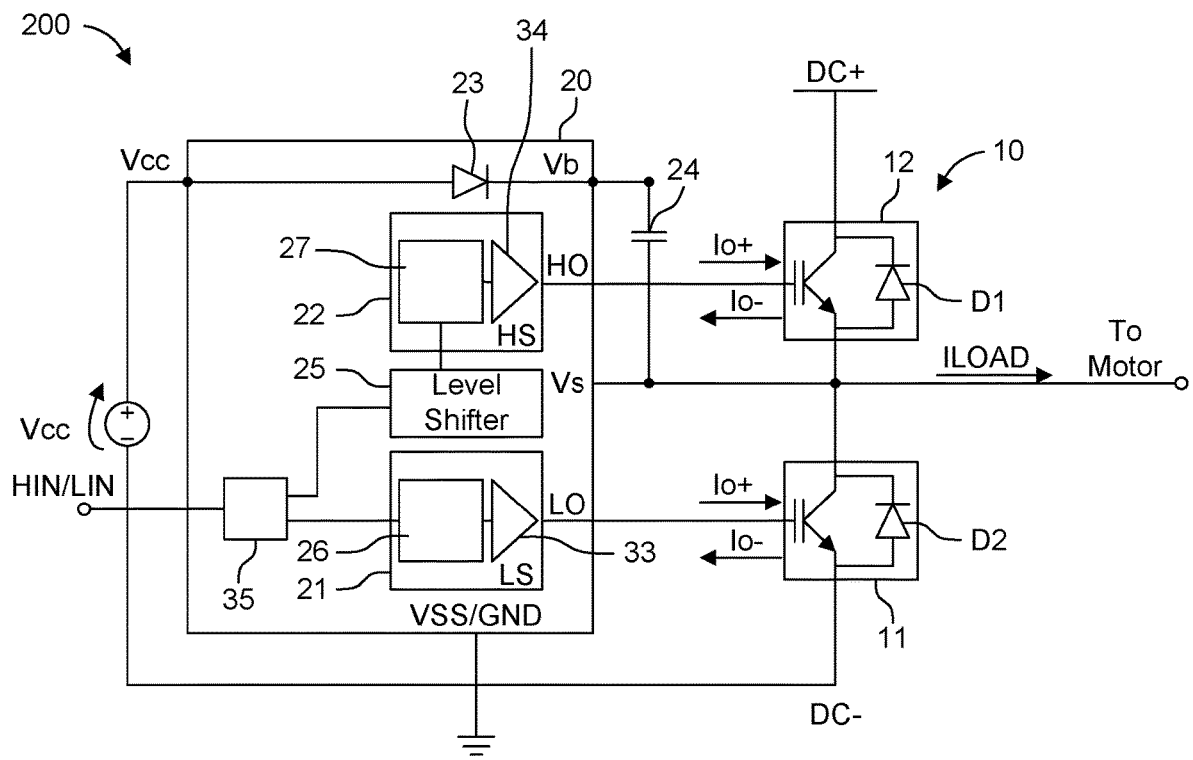
FIG. 2 is a schematic block diagram of a power inverter system according to one or more embodiments.

FIG. 2 is a schematic block diagram of a power inverter system 200 according to one or more embodiments. The power inverter system 200 includes a single-phase motor drive stage 10 (i.e., an inverter leg) and a gate driver 20 electrically coupled to the single-phase motor drive stage 10.

The single-phase motor drive stage 10 includes a low-side transistor 11 and a high-side transistor 12 that are controlled for supplying a load current $I_{LOAD}$ to the motor (not illustrated). Both transistors 11 and 12 may be Superjunction devices, and may be either MOSFETs (SJ-MOSFETS) or IGBTs (SJIGBTs), but is not limited to superjunction devices.

The gate driver 20 is a monolithic high voltage (HV) gate driver, that includes a low voltage (LV) gate driver 21 used to drive the low-side transistor switch 11 and an HV gate driver 22 used to drive the high-side transistor switch 12. Both gate drivers 21 and 22 perform gate driving of their respective power transistor 11 and 12 based on PWM signals LIN and HIN received from a microcontroller unit (MCU). The PWM signals are control signals received from the MCU at PWM logic unit 35 of the gate driver 20. The PWM logic unit 35 receives the LIN and HIN signals from the MCU and ensures there is a minimum dead time implemented to prevent bridge shoot through. Eventually, the respective PWM signals are passed on to the respective low-side and high-side gate driver 21 and 22, where the PWM signal HIN to the high-side gate driver 22 is passed through a HV level shifter 25. After this point, the low-side and high-side gate driver 21 and 22 perform dv/dt regulation and gate driving.

Both gate drivers 21 and 22 include separate pre-driver circuitry 26 and 27 and buffers 33 and 34, respectively. The pre-driver circuitries 26 and 27 are configured to receive the PWM signals and, based thereon, control the on/off state of a respective first current source, such as a source FET, used to generate current Io+. Additionally, the pre-driver circuitries 26 and 27 are configured to receive the PWM signals and, based thereon, control the on/off state of a respective second current source, such as a sink FET, used to generate current Io−. The respective current sources are provided in buffers 33 and 34. Thus, the buffers 33 and 34 may each include a pair of complementary FETs used to generate turn-on currents Io+ and turn-off currents Io− for the respective power transistor 11 and 12.

Each of the pre-driver circuitries 26 and 27 may further include a dV/dt regulator that is configured to control the amplitudes of the ON current Io+ and the OFF current Io− via control of the current sources in the buffers 33 and 34. In other words, each dv/dt regulator commands a respective buffer 33 or 34 to use a certain current capability.

Thus, the LV gate driver 21 and the HV gate driver 22 each include pre-driver circuitry, a first current source, and a second current source, where the pre-driver circuitry includes a dV/dt regulator used for controlling the amplitude of the ON and OFF currents Io+ and Io− provided to/from the power transistor.

The LV gate driver 21 is arranged in a low voltage domain, whereas the HV gate driver is arranged in a high voltage domain. In practice, the gate driver 20 also includes a termination region (not illustrated) that isolates the high voltage domain from the low voltage domain, and may be referred to as an isolation termination region. Thus, the termination region provides a high voltage isolation barrier between the two voltage domains.

The gate driver 20 may be configured to receive PWM control signals, from an MCU, and turn on or turn off respective transistors 11 and 12 in accordance with the received PWM control signals. For example, during the turn-on process of a respective transistor 11 or 12, the gate driver 20 may be used to provide (source) a gate current to the gate of the respective transistor 11/12 in order to charge the gate. In contrast, during the turn-off process, the gate driver 20 may be used to draw (sink) a gate current from the gate of the transistor 11/12 in order to discharge the gate.

Thus, the MCU is electrically coupled to the gate driver 20 for the transmission of information and control signals therebetween, and the gate driver 20 is electrically coupled to the inverter leg 10 for driving the power transistors thereof.

The three regions, the HV domain, the LV domain, and the termination region are monolithically built in a single integrated circuit. The technology used to manufacture the gate driver 20 is capable of building all three regions on a single silicon die and build a single IC gate driver. In between the HV domain and the LV domain is the termination region whose main purpose is to electrically isolate the HV domain and the LV domain. Termination region in this specific technology (and in other high voltage technologies) includes a large diode usually used as bootstrap diode 23 to charge a bootstrap capacitor 24. The level shifter 25 is used to convert (i.e., level shift) the control signal, and thus transfer control information, from the low voltage/power domain to the high voltage/power domain.

In addition, Vb refers to the high-side floating supply voltage; Vs refers to the high-side floating ground voltage; Vcc refers to the low-side and logic fixed supply voltage; Vss refers to a low-side ground voltage; HO refers to the high-side floating output voltage; LO refers to the low-side output voltage; DC+ refers to DC− link positive; DC− refers to DC-link negative; and HIN and LIN refers to the logic input voltages (i.e., control signals) received from the MCU. In some cases, for example, when using galvanically separated dies, Vtypei and Vtype may be used to indicate two galvanically separated voltages or potentials of a similar voltage type. For example, Vcci and Vcc may be used that are related to a Vcc type, but are two galvanically separated voltages. Similarly, GNDI and GND may be used is such cases.

Typically, Vb=Vcc−Vs−Vd, where Vd is the voltage drop across the bootstrap diode 23. When Vcc=15V, Vs=0V, and the bootstrap diode 23 is forward biased and has a forward bias voltage drop of Vd=0.5V, then Vb=15V−0V−0.5V=14.5V That is, during normal operation Vb is about 15V above Vs due to the bootstrap capacitor 24 supplying to the high side. DC+, positive power supply rail, is typically in the range of 200-1200V, but not limited thereto. On top of this, Vs is equal to DC− (e.g., Vss or 0V) when the low side switch 11 is on (and switch 12 is off). DC− is a negative power supply rail and may be shorted to Vss, as shown, but need not be. In this case, Vb is near 15V and the bootstrap capacitor 24 is charging by Vcc through the bootstrap diode 23. Otherwise, Vs is equal to DC+ when the high side switch 12 is on (and switch 11 is off), in this case Vb is 15V above DC+ and the bootstrap capacitor 24 is slowly discharging, being that the bootstrap diode 23 is reverse biased and non-conducting.

The aforementioned voltages are set such that the high-side voltage domain operates in a higher voltage or power domain than that of the low-side voltage domain. For example, the low-side (external) supply voltage Vcc may be set to 15V and the high-side supply voltage Vb may be operated at a maximum voltage of 1215V when DC+ is 1200V.

The MCU, being coupled to the LV gate driver 21, is electrically coupled to the LV domain of the gate driver 20. Thus, the MCU is configured to generate PWM control signals for controlling the transistors 11 and 12, and transmit the control signals to the gate driver 20 at the LV domain. For example, the gate driver 20 is configured to receive instructions from the MCU to drive a motor phase (i.e., an inverter leg) connected to voltage Vs using the PWM control signals. These PWM control signals are received by the gate driver 20 at the LV domain (i.e., at input pins HIN and LIN) and passed through to the corresponding HV gate driver 22 and the LV gate driver 21 via the appropriate logic (e.g., the PWM logic 35 and, for the high-side, the level shifter 25). The LV gate driver 21 and the HV gate driver 22 and are configured to receive the PWM control signals and drive the corresponding power transistor 11 and 12 via output terminals HO and LO of the gate driver 20.

Figure 3:
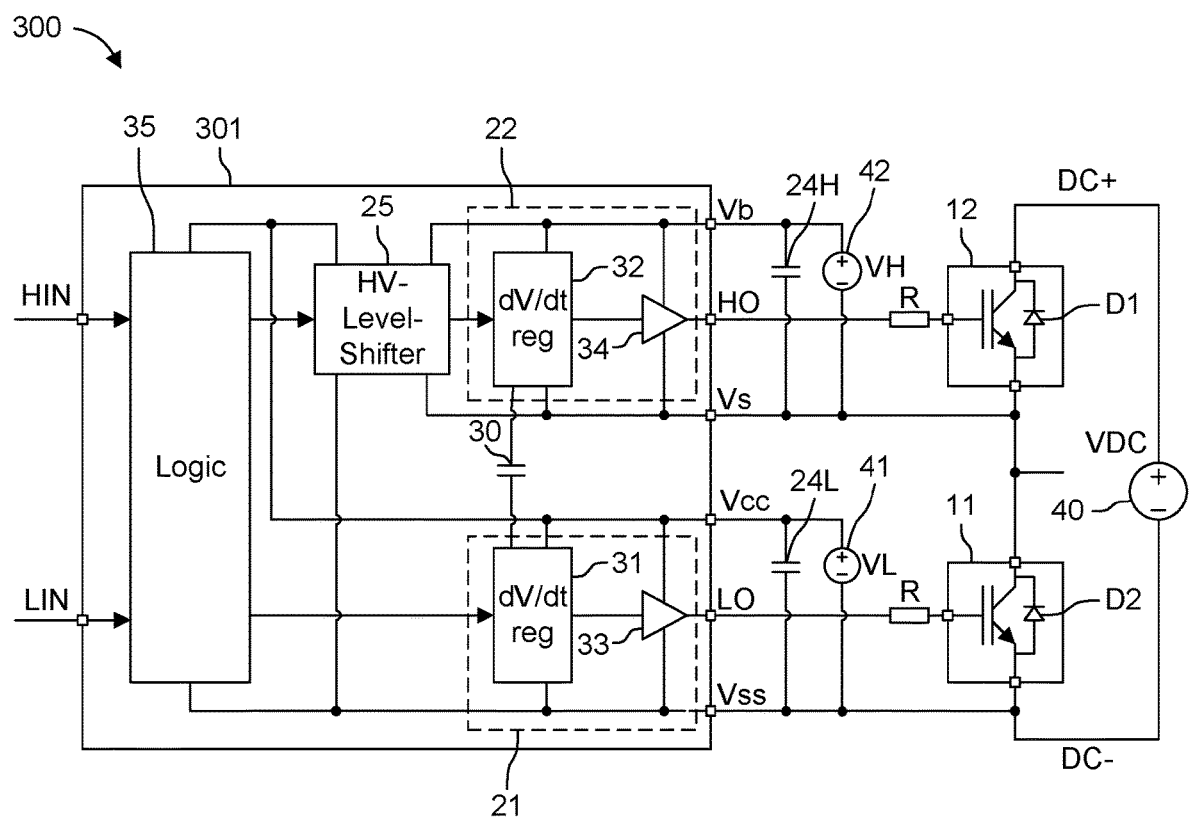
FIG. 3 is a schematic block diagram of a dV/dt sensing and regulating circuit according to one or more embodiments.
Figure 7:
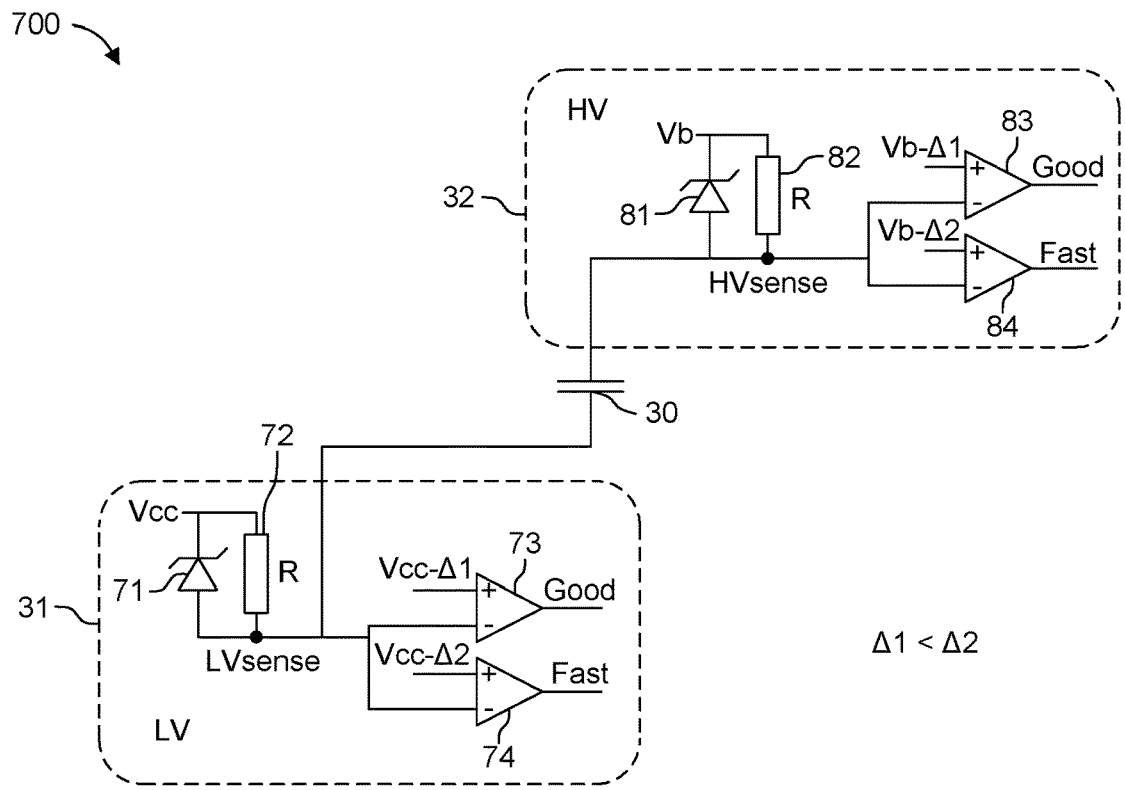
FIG. 7 is a schematic diagram of a dV/dt sensing circuit according to one or more embodiments.

FIG. 3 is a schematic block diagram of a dV/dt sensing and regulating circuit 300 according to one or more embodiments. The dV/dt sensing and regulating circuit 300 includes a monolithic gate driver IC 301 having two separate voltage islands. The dV/dt sensing and regulating circuit 300 is similar to the power inverter system 200 shown in FIG. 2, but further includes an HV capacitor 30 connected between the low-side gate driver 21 and the high-side gate driver 22 that is used to sense and regulate the switching dV/dt for both the low-side switch 11 and the high-side switch 12. For example, the HV capacitor 30 may be connected to the low-side gate driver 21 and the high-side gate driver 22 as shown in FIG. 7. The HV capacitor 30 in the present example is capable of handling 200-1200V, but is not necessarily limited thereto. In this arrangement, one or more HV capacitors 30 may be used. Freewheeling diodes D1 and D2 coupled to their respective power transistors 11 and 12 are also shown.

In addition, the LV gate driver 21 and the HV gate driver 22 each include a respective dV/dt regulator 31 or 32, which is integrated with the respective pre-driver circuitry in this example. Both dV/dt regulators 31 and 32 function in a similar manner by using the HV capacitor 30 to sense and regulate the switching dV/dt. In particular, the dV/dt regulators 31 and 32 use the HV capacitor 30 to measure the slope of dV/dt in an analog way. The measured slope can then be used to regulate dV/dt. The LV gate driver 21 and the HV gate driver 22 also each include a buffer 33 or 34, as previously described.

The dV/dt sensing and regulating circuit 300 further includes DC-link power supply 40 (VDC), a low-side gate driver power supply 41 (VL), a high-side gate driver power supply 42 (VH), a decoupling capacitor 24L (e.g., a bootstrap capacitor) coupled in parallel to the low-side gate driver power supply 41, a decoupling capacitor 24H (e.g., a bootstrap capacitor) coupled in parallel to the high-side gate driver power supply 42, and resistors R that provide a path for current to flow. Voltage VH is equal to Vb−Vs, and voltage VL is equal to Vcc−Vss (i.e., Vcc−GND).

The gate driver IC 301 includes a logic unit 35 that includes circuitry that processes signals received from a microcontroller via pins HIN and LIN, and also forwards PWM control signals from the MCU to the dV/dt regulators 31 and 32. Thus, eventually, the respective PWM control signal is passed on to the respective low side and high side gate driver 21 and 22. Where the signal to the high side gate driver is passed through the HV level shifter 25. After this point, dv/dt regulation and gate driving is performed based on the PWM control signal. The logic unit 35 also ensures minimum dead time is implemented to prevent bridge shoot through.

The HV capacitor 30 is substantially linear such that its voltage is proportional to the charge stored therein, and may be rated for at least 200V. The HV capacitor 30 may be placed across the two voltage domains, possibly external to the gate driver IC 301 or integrated thereon, to measure the voltage slope (dV/dt) in active hard switching applications and consequently regulate the next active switching event by adapting the Io+ current according to the measured voltage slope dV/dt. For active, hard switching events the slope of the voltage $V_{DS}$ or $V_{CE}$ (i.e., dV/dt) takes place after the power switch 11 or 12 has taken over the load current.

The HV capacitor 30 may be used by both dV/dt regulators 31 and 32 to measure the slope of dV/dt, including the slope of the "Fast" portion of dV/dt and the slope of the "tail" portion of dV/dt. The dV/dt regulators 31 and 32 may use the measured slope to regulate the next active switching event by adapting the Io+ current according to the measured voltage slope dV/dt. In addition, the dV/dt regulators 31 and 32 may use the measured slope to detect an instance where the dV/dt transitions from the fast portion to the tail portion. That is, the dV/dt regulators 31 and 32 can detect when an interval of the fast dV/dt expires and when an interval of the tail dV/dt begins.

After the time interval of the fast dV/dt has expired (i.e., after the slope has been measured), the dV/dt regulators 31 and 32 may automatically allow the current Io+ to increase to its maximum value (Io+max) to cut the long second tail effect of dV/dt. Here, "cut" means to maximize dV/dt after the fast dV/dt period such that the duration of the tail effect is reduced or eliminated altogether. By maximizing dV/dt, the voltage $V_{DS}$ progresses more quickly towards DC+ or DC−, whichever is applicable. In this case, gate drivers 21 and 22 are configured to provide a full, maximum current Io+ to the gate of their respective transistor 11 or 12 such that the duration of the tail effect is reduced.

The advantage of this solution is the ability to detect every type of dV/dt (i.e., totally passive, partially passive, or active) and to select only the active ones to use for regulating the voltage slope dV/dt.

The dV/dt regulators 31 and 32 may be configured to target a particular slope for the fast dV/dt, and regulate the next active switching event by adapting the Io+ current according to the measured voltage slope dV/dt in order to maintain the slope of the fast dV/dt at the target slope or within a target range.

For example, the order of magnitude of the target dV/dt may be 5V/ns, which is a good compromise between electromagnetic noise and power dissipation in the power switches 11 and 12. In this example, the HV capacitor 30 may have a 0.1 pF capacitance, which at a target slope of 5 V/ns, gives 500 μA, a current easily detectable and measurable.

For the HV capacitor 30, an external high voltage capacitance may be used, or the capacitor 30 may be integrated on the gate driver IC. Several solutions to build such an HV capacitance on chip can be used.

One possibility is to use a bond wire from a pad in the HV side/domain to a floating pad in the LV side/domain, both pads being on the same IC, and use a pad metal-polysilicon capacitance of the IC as the HV capacitor 30. The bond wire may be used since a metal layer is typically not permitted to cross the termination region.

Another possibility is to use a metal-to-metal capacitance, where two different metal layers are used. There is a physical relation between the oxide thickness and the voltage applied that can be sustained. For example, for 600V applications the minimum thickness of oxide layer may be 4 μm.

Another possibility is to use n+ silicon instead of polysilicon as a second electrode.

In general, any pair of conductive layers can be used together with one or more dielectric layers in between for the capacitor 30. This gives some degree of freedom in finding the dielectric thickness needed by the voltage rating.

Another possibility to permit a modular extension to higher voltage is to use two more capacitors in series.

Figure 4A:
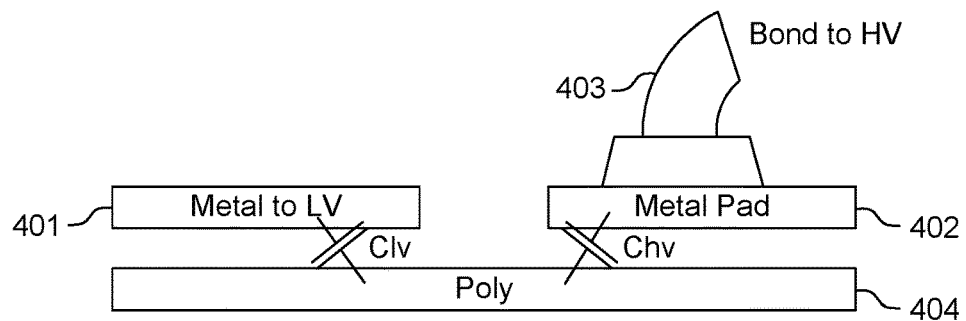
FIGS. 4A-4C show schematic views of different options for integrating an HV capacitor on the gate driver IC according to one or more embodiments.
Figure 4B:
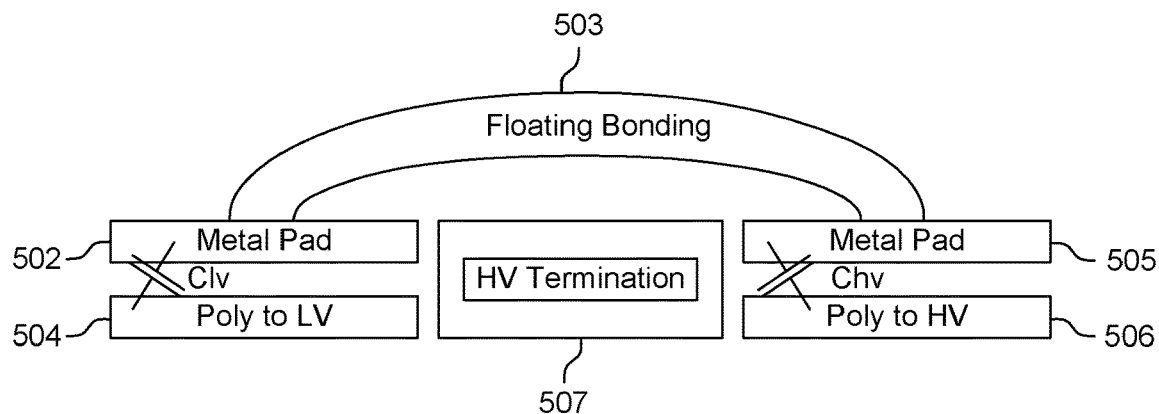
Figure 4C:
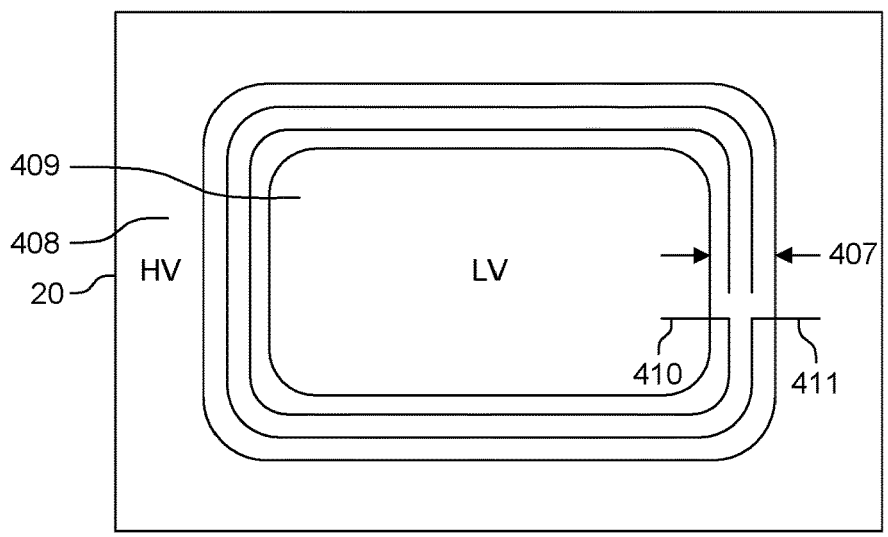

FIGS. 4A-4C show schematic views of additional options for integrating an HV capacitor on the gate driver IC.

For example, FIG. 4A shows a metal layer 401 in the LV side and a floating metal pad 402 in the LV side of the gate driver IC, where the metal pad 402 is coupled to a bond wire 403 that is coupled to a metal pad (not illustrated) in the HV side of the gate driver IC. A polysilicon layer 404 in the LV side is further provided. The metal-polysilicon capacitance Clv and the pad metal-polysilicon capacitance Chv may be used in series as the HV capacitor 30.

FIG. 4B shows a metal pad 502 in the LV side and a metal pad 505 in the HV side coupled together by a bond wire 503. The LV side and the HV side further include respective polysilicon layers 504 and 506. The LV side and the HV side of the gate driver IC are separated by a HV termination region 507 that isolates the HV side from the LV side. The pad metal-polysilicon capacitance Clv and the pad metal-polysilicon capacitance Chv may be used in series as the HV capacitor 30. In this implementation, the two metal pads 502 and 505 and their bond wire 503 are left floating, so their exact voltage when the entire gate driver IC 20 is tied to 0 V is unknown. Even so, the voltage between the floating part and the chip should be in the few volts range.

FIG. 4C shows a plan view of a gate driver IC 20 according to one or more embodiments. In particular, the HV domain 408, the LV domain 409, and the HV termination region 407 are shown, where the HV termination region 407 separates the two voltage domains 408 and 409. In addition, two metal concentric rings 410 and 411 (or c-shaped) are provided in the HV termination region 407 above the HV well border, where one metal ring 410 is connected to the LV domain 409, and the other metal ring 411 is connected to the HV domain 408. The portion of metal ring 410 that is coupled to the LV domain 409 is used as a low voltage metal electrode of the capacitor 30, while the portion of metal ring 411 that is coupled to the HV domain 408 is used as a high voltage metal electrode of the capacitor 30.

The precision of the dV/dt measurements is affected by the precise value of such capacitors. Even still, the accuracy of the using the described dV/dt regulation is +/−40%, while systems that do not use dV/dt regulation have an accuracy of +−/66% to +/−300%. Thus, overall system accuracy can be improved using the dV/dt regulation techniques described herein. If multiple capacitors or sensing circuits with resistors or comparator levels as in FIG. 7 is used, trimming can be done by changing a capacitance, resistor, or comparator reference value in order to increase the accuracy further.

Figure 5:
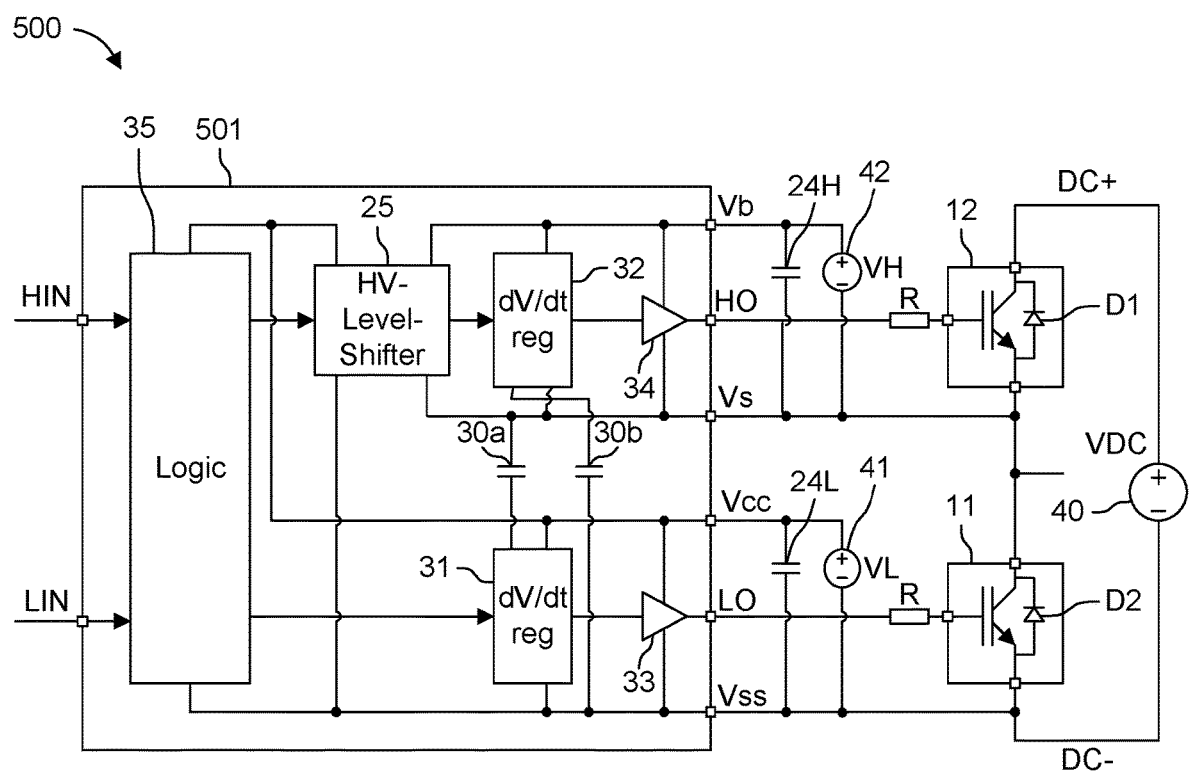
FIG. 5 is a schematic block diagram of a dV/dt sensing and regulating circuit according to one or more embodiments.

FIG. 5 is a schematic block diagram of a dV/dt sensing and regulating circuit 500 according to one or more embodiments. The dV/dt sensing and regulating circuit 500 includes a monolithic gate driver IC 501 having two separate voltage islands. The gate driver IC 501 is similar to the gate driver IC 301 illustrated in FIG. 3, but uses dual HV capacitors 30a and 30b instead of a single HV capacitor 30. Thus, the dV/dt regulators 31 and 32 each use a respective HV capacitor 30a or 30b to measure the voltage slope dV/dt of their respective power transistor 11 or 12, and to update a respective register value based on the measurement. The corresponding dV/dt regulator reads the register value to determine the current level of the current Io+, and controls the two current sources to implement the determined current level of the current Io+.

The HV capacitors 30a and 30b, are integrated as shown to measure the voltage slope dV/dt. HV capacitor 30a is coupled to voltage Vs (i.e., the floating ground voltage of the high-side region) and to an input node of the low side dV/dt regulator 31 (e.g., to an LVsense node, further described in FIGS. 7 and 10). The voltage Vs pin of the gate driver IC 501 is coupled to the collector of the low-side switch 11 and to the emitter of the high-side switch 12. HV capacitor 30b is coupled to ground Vss/GND (i.e., the ground voltage of the low-side region) and to an input node of the high side dV/dt regulator 32 (e.g., to an HVsense node, further described in FIGS. 7 and 10).

Alternatively, a single HV capacitor 30 may be used as shown in FIG. 3 and FIG. 7, described below. Thus, in the embodiment shown in FIG. 5, the single HV capacitor could be coupled to both input nodes of the dV/dt regulators 31 and 32.

Figure 6A:
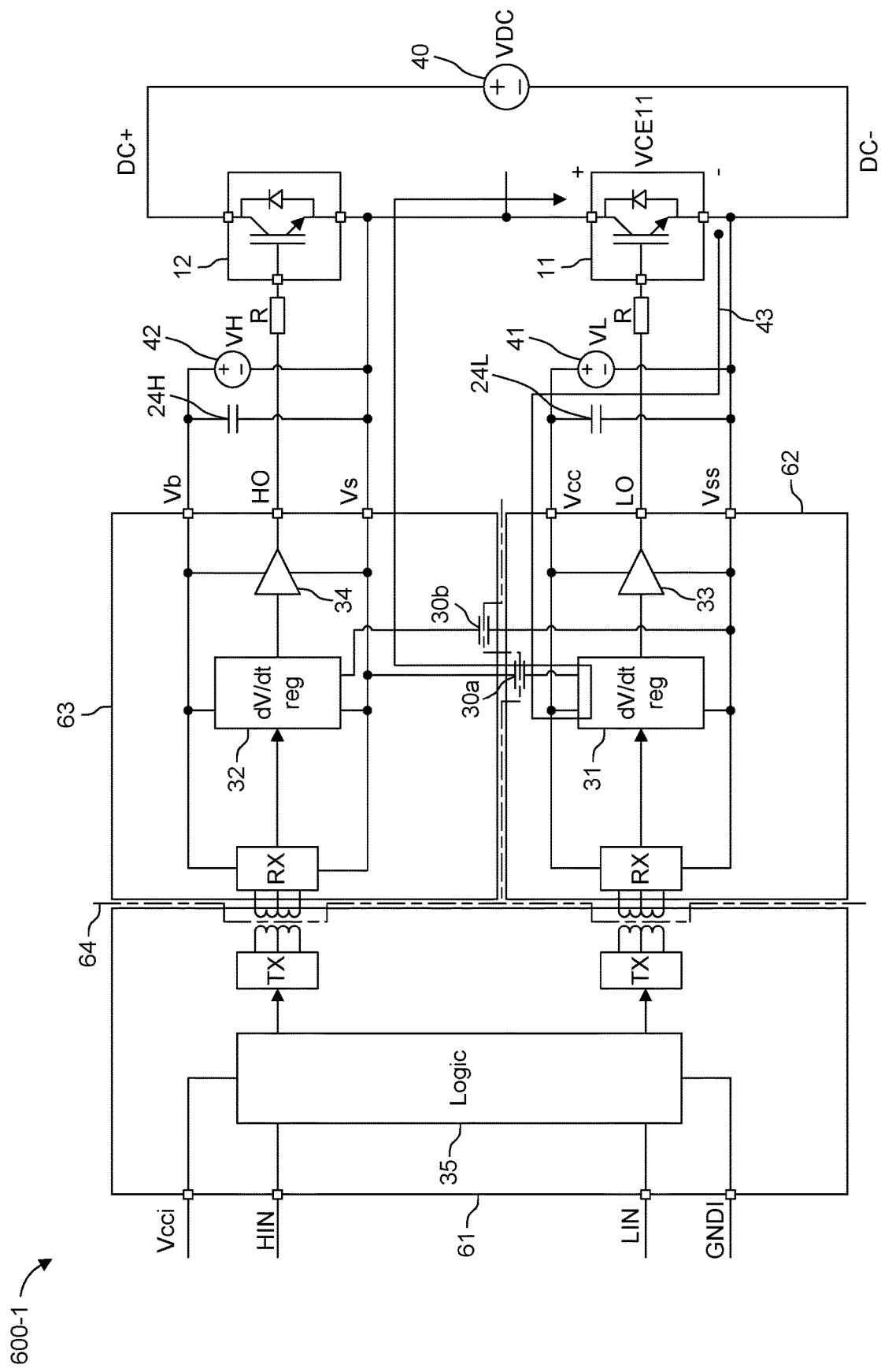
FIG. 6A is a schematic block diagram of a dV/dt sensing and regulating circuit according to one or more embodiments.

FIG. 6A is a schematic block diagram of a dV/dt sensing and regulating circuit 600-1 according to one or more embodiments. The dV/dt sensing and regulating circuit 600-1 includes a multi-die gate driver having three separate voltage islands. In this case, galvanic isolation between the ICs is used to galvanically separate the dies. The gate driver includes elements previously described in FIGS. 2, 3 and 5. The three separate voltage islands include a logic IC 61, a low voltage IC 62, and a high voltage IC 63. The logic IC 61 provides information from the logic unit 35 to ICs 62 and 63 via transformers indicated by TX and RX. Alternatively, the information could be transferred by capacitors, or another method of signal transfer. The galvanic isolation barrier 64 is represented by the dotted line between the different voltage islands.

The dV/dt regulators 31 and 32 use the HV capacitors 30a and 30b, which are integrated as shown, to measure the voltage slope dV/dt. Specifically, the HV capacitor 30a is integrated on the low voltage IC 62 (i.e., the low-side gate driver) and the HV capacitor 30b is integrated on the high voltage IC 63 (i.e., the high-side gate driver). The HV capacitor 30a is coupled to voltage Vs (i.e., the floating ground voltage of the high-side region) and to an input node of the low side dV/dt regulator 31 (e.g., to an LVsense node, further described in FIGS. 7 and 10). The voltage Vs pin of the high voltage IC 63 is coupled to the collector of the low-side switch 11 and to the emitter of the high-side switch 12. The HV capacitor 30b is coupled to ground Vss/GND (i.e., the ground voltage of the low-side region) and to an input node of the high side dV/dt regulator 32 (e.g., to an HVsense node, further described in FIGS. 7 and 10).

FIG. 6A further illustrates the dVCE11/dt sensing path 43 (i.e., the dV/dt sensing of the low-side transistor 11). The derivative of the VCE voltage of power transistor 11 is to be sensed by the dV/dt regulator 31. The VCE voltage of 11 is marked as VCE11. VH is the voltage of the power supply of the high voltage IC 63, with a decoupling capacitor 24H in parallel. VL is the voltage of the power supply of the low voltage IC 62, with a decoupling capacitor 24L in parallel. The power supply applied over the half bridge formed by power transistor 11 and 12 is coming from voltage source 40 with the voltage VDC. The dv/dt regulators 31 and 32 together with capacitor 30 (30a and 30b) are described in FIGS. 7 and 10.

The sensing path 43 from the emitter of power transistor 11 to the collector of power transistor 11 is as follows: the sensing path 43 starts at the emitter of the power transistor 11 (DC− or Vss), and follows through VL or the decoupling capacitor 24L to Vcc. The sensing path 43 continues from Vcc through the resistor 72 of the dV/dt regulator 31 to the LVsense node (see FIGS. 7 and 10) and continues through capacitor 30a to Vs, which is equivalent to the collector or power transistor 11.

If one considers Kirchhoffs voltage law, it is as follows: VCE11=VL−VR72+VC30a, where VR72 is the voltage across resistor 72 and VC30a is the voltage across capacitor 30a. If one derivates this formula and at the same time assumes that the derivative of VL is 0 (i.e., the derivative of a DC voltage is 0) and that the derivative of VR72 is much lower than the derivative of VCE11 then: dVCE11/dt=dVC30a/dt. Then the current flowing through capacitor 30a equals iC30a=C30a*dVCE11/dt, and the voltage drop over resistor 72 equals VR72=R72*iC30a=R72*C30a*dVCE11/dt.

Figure 6B:
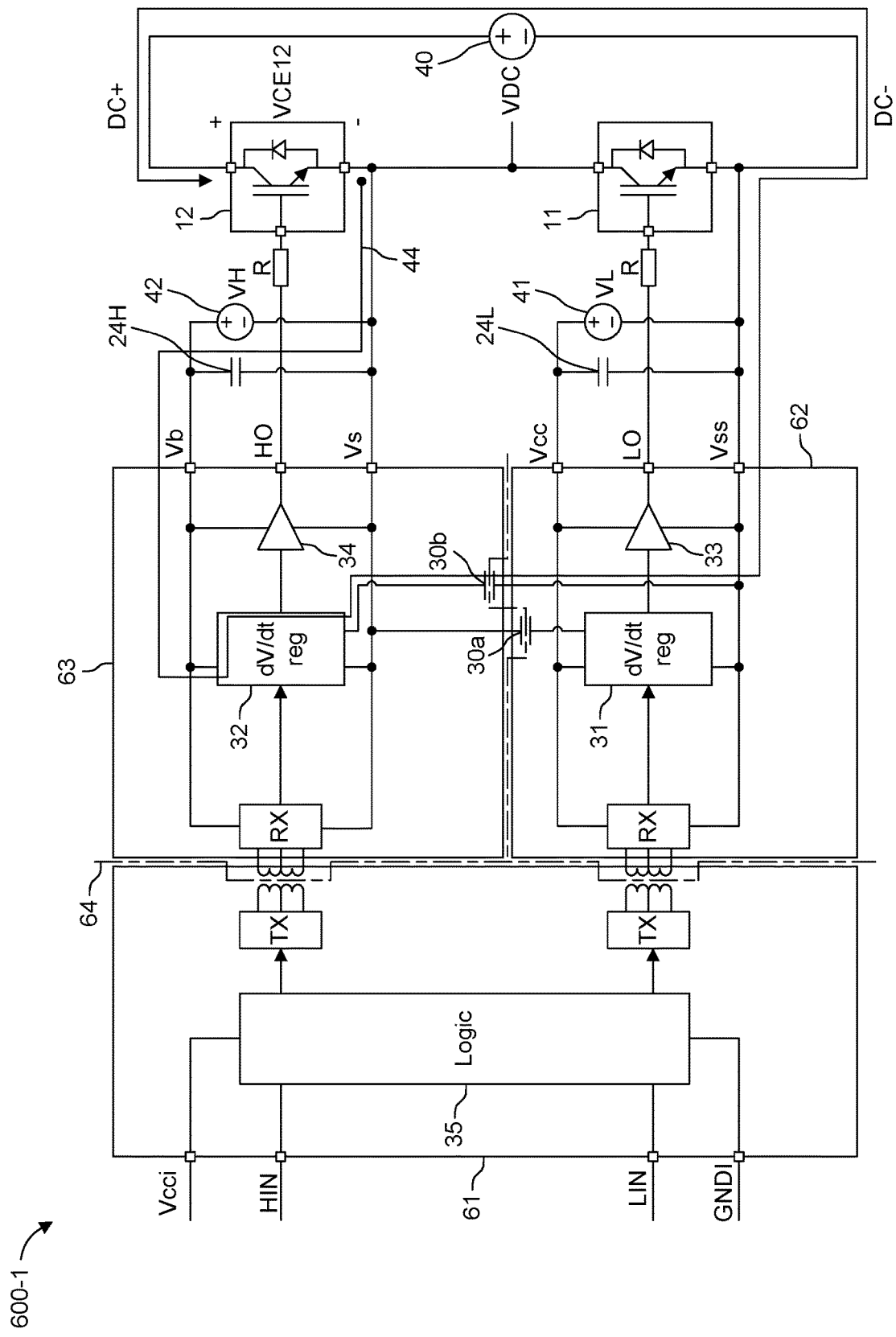
FIG. 6B is a schematic block diagram of a dV/dt sensing and regulating circuit according to one or more embodiments.

FIG. 6B is a schematic block diagram of a dV/dt sensing and regulating circuit 600-1 according to one or more embodiments. Specifically, FIG. 6B is equivalent to FIG. 6A with the exception that FIG. 6B illustrates the dVCE12/dt sensing path 44 (i.e., the dV/dt sensing of the high-side transistor 12).

The derivative of the VCE voltage of power transistor 12 is to be sensed by the dV/dt regulator 32. The VCE voltage of 12 is marked as VCE12. The sensing path 44 from the emitter of power transistor 12 to the collector of power transistor 12 is as follows: the sensing path 44 starts at the emitter of the power transistor 12 (Vs), and follows through VH or the decoupling capacitor 24H to Vb. The sensing path 44 continues through the resistor 82 of the dV/dt regulator 32 to the HVsense node (see FIGS. 7 and 10) and continues through capacitor 30b to Vss. The sensing path 44 continues through the DC-Link power supply VDC to DC+, which is equivalent to the collector of the power transistor 12.

If one considers Kirchhoff's voltage law, it is as follows: VCE12=VH−VR82−VC30b+VDC, where VR82 is the voltage across the resistor 82 and VC30b is the voltage across the HV capacitor 30b. If one derivates this formula and at the same time assumes that the derivative of VH and VDC is 0 (i.e., the derivative of a DC voltage is 0) and that the derivative of VR82 is much lower than the derivative of VCE12 then: dVCE12/dt=−dVC30b/dt. Then, the current flowing through capacitor 30a equals iC30b=C30b*(−dVCE12/dt) and the voltage drop over resistor 82 equals VR82=R82*iC30b=R72*C30b*(−dVCE12/dt).

Figure 6C:
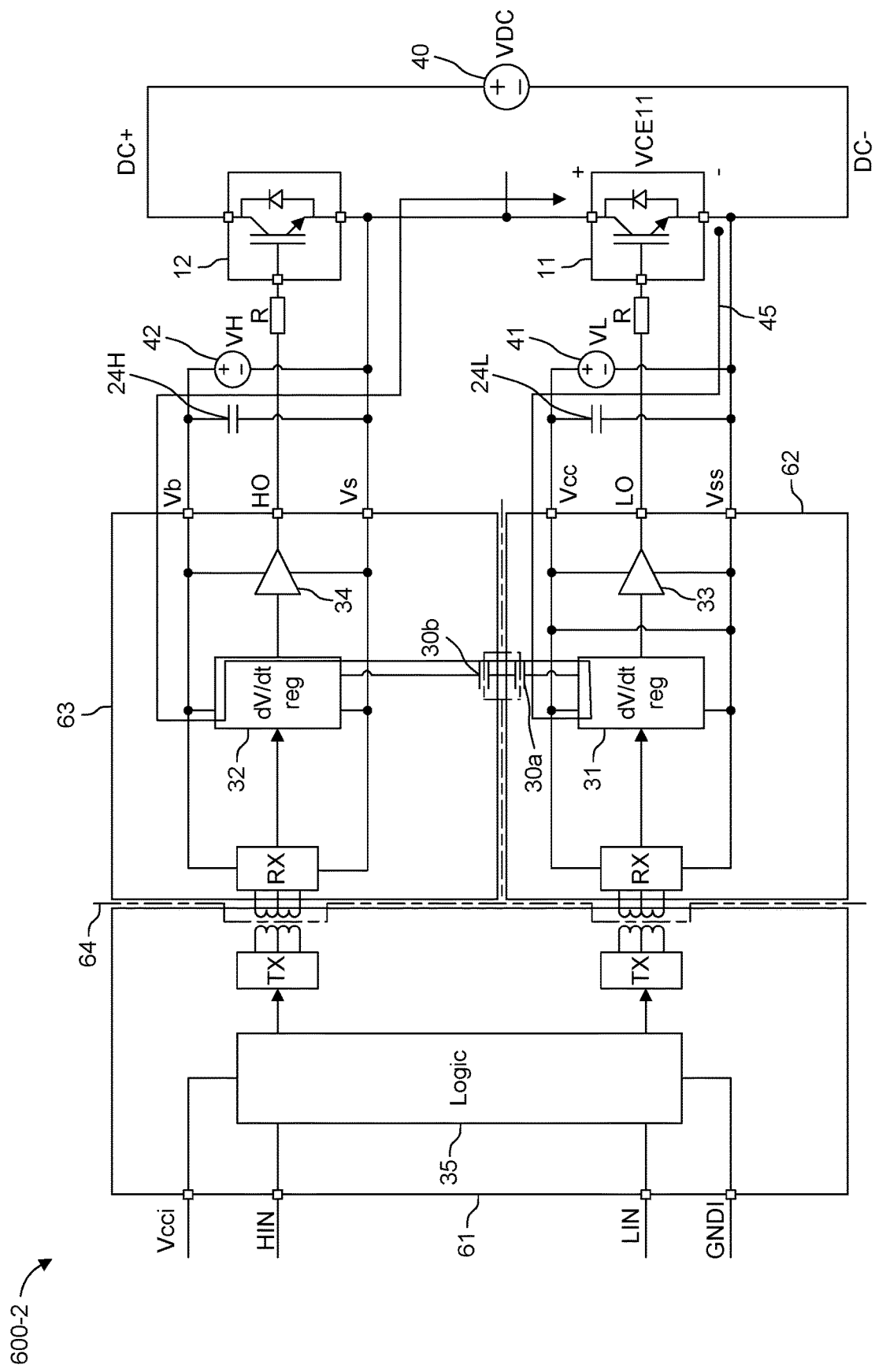
FIG. 6C is a schematic block diagram of a dV/dt sensing and regulating circuit according to one or more embodiments.

FIG. 6C is a schematic block diagram of a dV/dt sensing and regulating circuit 600-2 according to one or more embodiments. The dV/dt sensing and regulating circuit 600-2 includes a multi-die gate driver having three separate voltage islands. In this case, galvanic isolation between the ICs is used. The gate driver includes elements previously described in FIGS. 2, 3, 5, 6A, and 6B. The three separate voltage islands include a logic IC 61, a low voltage IC 62, and a high voltage IC 63. The logic IC 61 provides information from the logic unit 35 to ICs 62 and 63 via transformers indicated by TX and RX. Alternatively, the information could be transferred by capacitors, or another method of signal transfer. The galvanic isolation barrier 64 is represented by the dotted line between the different voltage islands.

The dV/dt regulators 31 and 32 use the HV capacitors 30a and 30b, which are integrated as shown, to measure the voltage slope dV/dt. Specifically, the HV capacitor 30a is integrated on the low voltage IC 62 and the HV capacitor 30b is integrated on the high voltage IC 63. The HV capacitors 30a and 30b are coupled together such that the HV capacitor 30a is coupled to the HV capacitor 30b and to an input node of the low side dV/dt regulator 31 (e.g., to an LVsense node, further described in FIGS. 7 and 10). The HV capacitor 30b is coupled to the HV capacitor 30a and to an input node of the high side dV/dt regulator 32 (e.g., to an HVsense node, further described in FIGS. 7 and 10).

Thus, the feature of dV/dt sensing and control can be fully integrated without adding any additional pins. A monolithic solution having two separate voltage islands may be used. Alternatively, in a multi-die solution, galvanic isolation between the chips and three separate voltage islands may be used. In both cases, no additional voltage island is needed to be added due to the dV/dt sensing.

FIG. 6C further illustrates the dVCE11/dt sensing path 45 (i.e., the dV/dt sensing of the low-side transistor 11). The derivative of the VCE voltage of power transistor 11 is to be sensed by the dV/dt regulator 31. As before, the VCE voltage of 11 is marked as VCE11 and the dv/dt regulator 31 and 32 together with capacitor 30 (30a and 30b) are described in FIGS. 7 and 10.

The sensing path 45 from the emitter of power transistor 11 to the collector of power transistor 11 is as follows: the sensing path 43 starts at the emitter of the power transistor 11 (DC− or Vss), and follows through VL or the decoupling capacitor 24L to Vcc. The sensing path 45 continues from Vcc through the resistor 72 of the dV/dt regulator 31 to the LVsense node (see FIGS. 7 and 10) and continues through capacitors 30a and 30b to the HVsense node (see FIGS. 7 and 10). From the HVsense node, the sensing path 45 continues through resistor 82 to Vb and then through VH or the decoupling capacitor 24H to Vs, which is equivalent to the collector or power transistor 11.

If one considers Kirchhoff's voltage law, it is as follows: VCE11=VL−VR72+VC30−VR82−VH. If one derivates this formula and at the same time assumes that the derivative of VH and VL is 0 (i.e., the derivative of a DC voltage is 0) and that the derivative of VR72 and VR82 is much lower than the derivative of VCE11 then: dVCE11/dt=dVC30/dt. Then, the current flowing through capacitors 30a and 30b equals iC30=C30*dVCE11/dt, and the voltage drop over resistor 72 equals VR72=R72*iC30=R72*C30*dVCE11/dt.

Figure 6D:
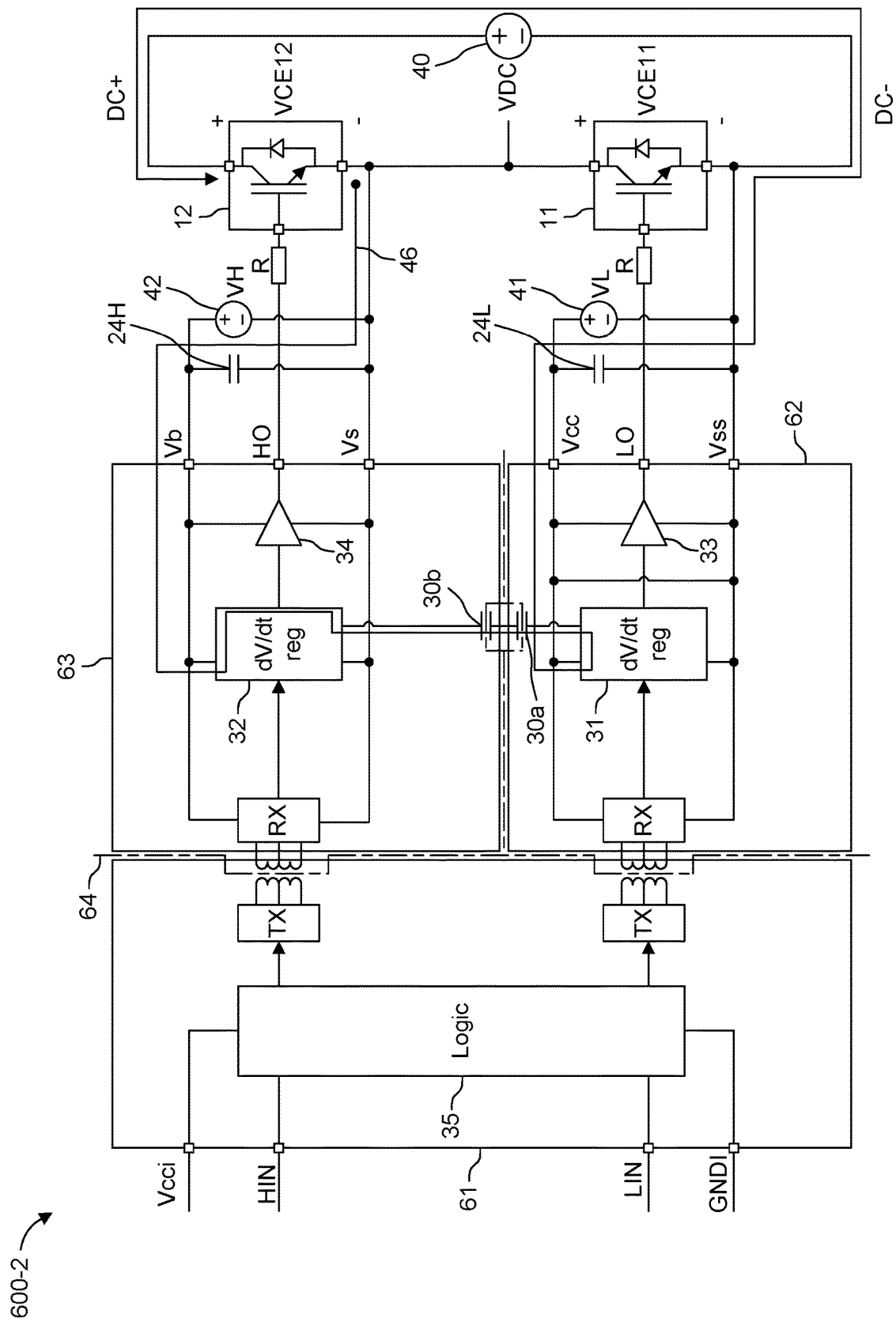
FIG. 6D is a schematic block diagram of a dV/dt sensing and regulating circuit according to one or more embodiments.

FIG. 6D is a schematic block diagram of a dV/dt sensing and regulating circuit 600-2 according to one or more embodiments. Specifically, FIG. 6D is equivalent to FIG. 6C with the exception that FIG. 6D illustrates the dVCE12/dt sensing path 46 (i.e., the dV/dt sensing of the high-side transistor 12).

The derivative of the VCE voltage of power transistor 12 is to be sensed by the dV/dt regulator 32. The VCE voltage of 12 is marked as VCE12. The sensing path 46 from the emitter of power transistor 12 to the collector of power transistor 12 is as follows: the sensing path 46 starts at the emitter of the power transistor 12 (Vs), and follows through VH or the decoupling capacitor 24H to Vb. The sensing path 44 continues through the resistor 82 of the dV/dt regulator 32 to the HVsense node (see FIGS. 7 and 10) and continues through capacitors 30b and 30a to the LVsense node (see FIGS. 7 and 10). From the LVsense node, the sensing path 46 continues through resistor 72 to Vcc and then through VL or the decoupling capacitor 24L to Vss, The sensing path 46 continues through the DC-Link power supply VDC to DC+, which is equivalent to the collector of the power transistor 12.

If one considers Kirchhoff's voltage law, it is as follows: VCE12=VH−VR82−VC30−VR72−VL+VDC. If one derivates this formula and at the same time assumes that the derivative of VH, VL, and VDC are 0 (i.e., the derivative of a DC voltage is 0) and that the derivative of VR72 and VR82 is much lower than the derivative of VCE12 then: dVCE12/dt=−dVC30/dt. Then, the current flowing through capacitors 30a and 30b equals iC30=C30*(−dVCE12/dt), and the voltage drop over resistor 82 equals VR82=R82*iC30=R72*C30*(−dVCE12/dt).

Thus, in consideration of the sensing paths 43-46 and due to the fact that the derivative of a DC voltage source is zero, any voltage power supply in the chain of sensing the derivative of the VCE voltage of the driven power transistor with a capacitor can be treated as a short. There may also be a demand on the design of the respective power supply to have a low impedance at the give frequency component the derivative of the VCE voltage will contain.

As will be described in further detail, one or more HV capacitors can be used for sensing (e.g., sampling by an ADC or a directly with a linear circuit) the dV/dt of a driven switch in order to regulate the dV/dt of the driven switch. The HV capacitor(s) are indirectly connected between the driver and the collector/drain of the driven switch, where indirectly means through one or more decoupling capacitors in the power circuit in which the driven switch is used.

FIG. 7 is a schematic diagram of a dV/dt sensing circuit 700 according to one or more embodiments. In particular, the dV/dt sensing circuit 700 includes the HV cap 30 electrically coupled between the dV/dt regulator 31 and the dV/dt regulator 32.

The dV/dt regulator 31 includes a Zener diode 71 and a sense resistor 72 coupled in parallel between a local voltage supply Vcc and an LVsense node. The LVsense node is further electrically coupled to the HV capacitor 30 and to respective inputs of two comparators 73 and 74. The two comparators have different threshold levels (i.e., reference voltages) provided at one of the comparator's inputs (e.g., the V+ input). For example, the first comparator 73 receives a first reference voltage equal to Vcc−Δ1, and the second comparator 74 receives a second reference voltage equal to Vcc−Δ2, where Δ1 is less than Δ2, and Δ1 and Δ2 are configurable.

LVsense is an analog node, so it senses the slope in an analog way. In other words it linearly senses the slope dV/dt due to the linearity of the HV capacitor 30 and the sensitivity of the node is configurable (e.g., according to the selection of the HV capacitor 30 and the sense resistor R). For example, the value of the sense resistor R can be selected such that the voltage at the LVsense node is equal to Vcc−1V in case of a dV/dt slope of 1000 V/microsecond. The sense resistor R may be a variable resistor that can be adjusted based on the desired sensitivity. As a result, the voltage at the LVsense node represents a slope dV/dt of VDS of the power transistor 11 and is proportional thereto.

The following example demonstrates how the voltage at the LVsense node may react to the slope of dV/dt. In a case that there is no dV/dt (i.e., $V_{DS}$ of the power switch is in a steady state), LVsense is equal to Vcc. For an active fast portion of dV/dt having a slope of 5000 V/microsecond, LVsense may equal Vcc−5V. For a passive fast portion of dV/dt having a slope of 1500 V/microsecond, LVsense may equal Vcc−1.5V. For a tail portion of dV/dt having a slope of 5 V/microsecond, LVsense may equal Vcc−0.005V. Thus, the voltage at the LVsense node is representative of a magnitude of the slope dV/dt of $V_{DS}$ of the power transistor 11.

The output "Good" of the first comparator 73 is active (e.g., "1") when the voltage at the LVsense node is less than the first reference voltage Vcc−Δ1, and is "0" otherwise. The output "Fast" of the second comparator 74 is active (e.g., "1") when the voltage at the LVsense node is less than the second reference voltage Vcc−Δ2, and is "0" otherwise. The outputs of the comparators 73 and 74 are then provided to a processing circuit, which applies the output values to a rule set. The processing circuit then determines a result based on the rule set. The result may be output from the processing circuit in the form of instructions to the logic of the LV gate driver 21 to regulate the ON current Io+ provided to the power transistor 11.

The dV/dt regulator 32 includes a Zener diode 81 and a sense resistor 82 coupled in parallel between a local voltage supply Vb and an HVsense node. The HVsense node is further electrically coupled to the HV capacitor 30 and to respective inputs of two comparators 83 and 84. The two comparators have different threshold levels (i.e., reference voltages) provided at one of the comparator's inputs (e.g., the V+ input). For example, the first comparator 83 receives a first reference voltage equal to Vb−Δ1, and the second comparator 84 receives a second reference voltage equal to Vb−Δ2, where Δ1 is less than Δ2, and Δ1 and Δ2 are configurable.

Similar to LVsense, HVsense is an analog node, so it senses the slope in an analog way. In other words it linearly senses the slope dV/dt due to the linearity of the HV capacitor 30 and the sensitivity of the node is configurable (e.g., according to the selection of the HV capacitor 30 and the sense resistor R). For example, the value of the sense resistor R can be selected such that the voltage at the HVsense node is equal to Vb−1V in case of a dV/dt slope of 1000 V/microsecond. The sense resistor R may be a variable resistor that can be adjusted based on the desired sensitivity. As a result, the voltage at the HVsense node represents a slope dV/dt of VDS of the power transistor 12 and is proportional thereto.

The following example demonstrates how the voltage at the HVsense node may react to the slope of dV/dt. In a case that there is no dV/dt (i.e., $V_{DS}$ of the power switch is in a steady state), HVsense is equal to Vb. For an active fast portion of dV/dt having a slope of 5000 V/microsecond, HVsense may equal Vb−5V. For a passive fast portion of dV/dt having a slope of 1500 V/microsecond, HVsense may equal Vb−1.5V. For a tail portion of dV/dt having a slope of 5 V/microsecond, HVsense may equal Vb−0.005V. Thus, the voltage at the HVsense node is representative of a magnitude of the slope dV/dt of VDS of the power transistor 12.

The output "Good" of the first comparator 83 is active (e.g., "1") when the voltage at the HVsense node is less than the first reference voltage Vb−Δ1, and is "0" otherwise. The output "Fast" of the second comparator 84 is active (e.g., "1") when the voltage at the HVsense node is less than the second reference voltage Vb−Δ2, and is "0" otherwise. The outputs of the comparators 83 and 84 are then provided to a processing circuit, which applies the output values to a rule set. The processing circuit then determines a result based on the rule set. The result may be output from the processing circuit in the form of instructions to the logic of the HV gate driver 22 to regulate the ON current Io+ provided to the power transistor 12.

Thus, the HV capacitance 30 is connected to both local supplies (VCC for the low side and Vb for the high side) through a resistor 72/82 and a protection Zener diode 71/81. The HV side dV/dt regulator 32 is responsible for determining the positive dV/dt level which occurs at the turn on of the high switch 12 driven by the HV gate driver 22. The LV side dV/dt regulator 31 is responsible for determining the negative active dV/dt level which occurs at the turn on of the low switch 11 driven by the LV gate driver 21.

During a positive dV/dt event, the HVsense node is pulled down compared to the static voltage, i.e., Vb. Otherwise, the HVsense node is equal to the static voltage. Similarly, during a negative dV/dt event, the LVsense node is pulled down compared to the static voltage, i.e., Vcc. Otherwise, the LVsense node is equal to the static voltage. Both the HV capacitance of capacitor 30 and the resistor values of resistors 72 and 82 can be used for regulating the sensitivity of the respective dV/dt regulators 31 and 32. Trimming can also be used if necessary.

As noted above, two comparators are placed on each side (i.e., the LV side and the HV side) to sense the level reached by the HVsense and LVsense nodes with two different level of thresholds, where Δ1<Δ2. In this way, the logic signal "Good" will be active at slower (i.e., less steep) dV/dt with respect to "Fast" (i.e., steeper) dV/dt. In other words, the voltage range between Δ1 and Δ2 defines a target range in which the slope dV/dt is desired for the fast dV/dt portion shown in FIG. 1. The fast dV/dt portion is defined by a measurement interval during which measuring the slope of the fast dV/dt portion is enabled (and expected).

Thus, in a dV/dt event, there can be three valid combinations of the two logic signals output by a pair of comparators (i.e., comparator pair 73 and 74, or comparator pair 83 and 84).

A first valid combination includes when both comparator outputs are active. That is, when both "Good" and "Fast" logic signals are active. In this case, the fast dV/dt is faster than the target range indicating that the slope of the fast dV/dt portion in FIG. 1 is too steep.

A second valid combination includes when the output of comparator 73 is active and the output of comparator 74 is not active, or when the output of comparator 83 is active and the output of comparator 84 is not active. That is, when the "Good" logic signal is active and the "Fast" logic signal is not active. In this case, the fast dV/dt is within the target range indicating that the slope of the fast dV/dt portion in FIG. 1 is OK.

A third valid combination includes when both comparator outputs are not active. That is, when both "Good" and "Fast" logic signals are not active. In this case, the fast dV/dt is slower than the target range indicating that the slope of the fast dV/dt portion in FIG. 1 is too shallow. This could also mean that VDS is in a steady state and there is no slope dV/dt.

Since the width of the impulse sensed at the LVsense (HVsense) node is equal to the duration of the negative (positive) active dV/dt, which is in the order of hundred nanoseconds (e.g., in an example with DC+equal to 600V and target dV/dt of $$5\ V\Big/ns\left(\tau = \frac{600\ V}{5\ V/ns} = 120\ ns\right),$$

the comparators input signal from the respective sense node lasts sufficiently long to permit each comparator to not be very fast. Furthermore, the height of the impulse sensed on the node LVsense or HVsense is set by the value of the capacitor 30 and resistor 72/82 that can be freely chosen. Thus, the input signals at nodes LVsense and HVsense can be in single-digit voltage range by choosing the appropriate resistance for the resistor 72/82. The comparators 73, 74, 83, and 84 can so be made very simple. For example, simple CMOS inverters with different switching thresholds can be used as the comparators. CMOS inverters have an advantage of not dissipating static power, and since the static inputs are equal to the supply voltage, this is an advantage in bootstrap supplied systems where static power consumption in the HV region should be low.

Alternatively, other types of comparators or means of performing the comparison can be used, including, but not limited to ADC samplers that sample the value of the sense node and microprocessors that compare the sample to the two threshold levels. A linear circuit may also be used for measuring the dV/dt transient.

In summary, after a valid active switching measurement, there are three possible cases: dV/dt is faster than the target range, dV/dt is inside the target range, or dV/dt is slower than the target range. To converge towards the correct current Io+ needed by the application (taking also into account variable condition as temperature, supply voltage etc.), the measurement result is digitally integrated in a digital register using, as an example, an algorithm or rule set in the three measurement cases. In the first case (i.e., dV/dt is faster than the target range), the register value is decreased by 1 lowest significant bit (LSB). In the second case (i.e., dV/dt is inside the target range), the register value is maintained or kept unchanged. In the third case (i.e., dV/dt is slower than the target range), the register value is increased by 1 LSB.

Figure 8:
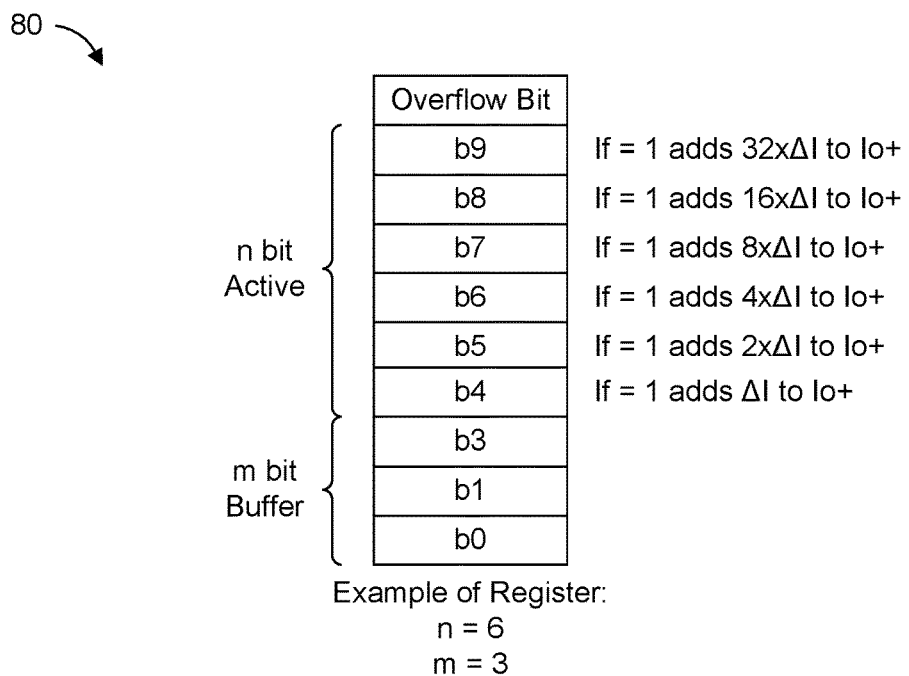
FIG. 8 shows an example of a register of a dV/dt regulator that stores a plurality of bits b0-b9 plus an optional overflow bit, where b0 is the LSB and b9 or the overflow bit is the most significant bit (MSB) according to one or more embodiments.

FIG. 8 shows an example of a register 80 of a dV/dt regulator that stores a plurality of bits b0-b9 plus an optional overflow bit, where b0 is the LSB and b9 or the overflow bit is the most significant bit (MSB). In addition, the register 80 may be divided into multiple segments, including a buffer part, an active part, and an overflow bit.

Each dV/dt regulator has a corresponding register 80 that indicates the amplitude of the Io+ current based on the binary coded value stored therein Alternatively, it will be appreciated that thermometer coding may be used. The logic of a respective HV or LV gate driver implements the Io+ current based on the register value. The register 80 has an n bits in the "active part" whose bits select and indicate a binary weighted Io+ current component. That is, the binary weighted Io+ current component adds an amplitude component to a default Io+ component. The default Io+ component is present in all cases as a low level of current that cannot be turned off. Otherwise, if there is no Io+ current, there cannot be an ON switching event, no dV/dt can be measured, and the system can be blocked.

Therefore, if bits b4-b9 are all zero, the Io+ current programmed by the dV/dt regulator is set to the default level Io+. If bit b4 stores a 1, then a current value ΔI is added to the default level Io+. If bit b5 stores a 1, then a current value 2ΔI is added to the default level Io+. If bit b6 stores a 1, then a current value 4ΔI is added to the default level Io+. If bit b7 stores a 1, then a current value 8ΔI is added to the default level Io+. If bit b8 stores a 1, then a current value 16ΔI is added to the default level Io+. If bit b9 stores a 1, then a current value 32ΔI is added to the default level Io+. The value stored in bits b4-b9 are adapted based on the outputs of a comparator pair (73 and 74 or 83 and 84) and the applied algorithm.

The register 80 can also have m "buffer" least significative bits that have no direct influence on the Io+ value, but can be used to stabilize the Io+ level to, for example, avoid a ping-pong effect.

Finally, the register 80 can also have an overflow bit used for fault condition detection. For example, the overflow bit may be used when the max Io+ current is not sufficient. This situation may occur when all n bits (i.e., bits b4-b9) are 1, and the dV/dt regulator still detect that the third case (i.e., dV/dt is slower than the target range). Since all n bits are "full", the register value cannot be further increased. Instead, a 1 is stored in the overflow bit to indicate to the system that current Io+ of the LV or HV gate driver cannot be further increased sufficiently to bring dV/dt within the target range.

The dV/dt regulator is configured to adapt the Io+ current based on the register value on the next active switching event. In other words, during a current or first active switching event, the dV/dt regulator measures the fast dV/dt transient and updates or maintains the register value based on the outputs of the comparators. On the next active switching event that follows the first active switching event, the dV/dt regulator reads the register value stored in register 80 and controls the amplitude of the I0+ current for the fast dV/dt period of the next active switching event based on the register value. Meanwhile, the dV/dt regulator again measures the fast dV/dt transient during the next active switching event and the process repeats.

In addition, after the period of the fast dV/dt has expired (e.g., the period may have a duration of 500 ns-1 us but is not limited thereto), the dV/dt regulator is configured to increase the Io+ current to its maximum value in order to cut the long second tail of dV/dt. The maximum value may be an "uncontrolled" level at which the current source (e.g., a source FET) that produces the Io+ current is fully turned on.

Conditions that determine the correct value for the Io+ current are slowly changing in time or not changing at all (e.g., switch characteristics, temperature, load current, supply, etc.) so the system is able to reach the target range and track the desired changes.

To avoid strobing the wrong measurements results into the register 80, dV/dt measure may be validated before strobing the result into the register.

A first level of validation is: measurement is valid only in a short time window (~500 ns-1 us) after the corresponding power device gate has started to rise (or after LIN/HIN turn on commutation). This should avoid most false measurements due to, as an example, a large DC bus noise due to another inverter leg switching.

Figure 9:
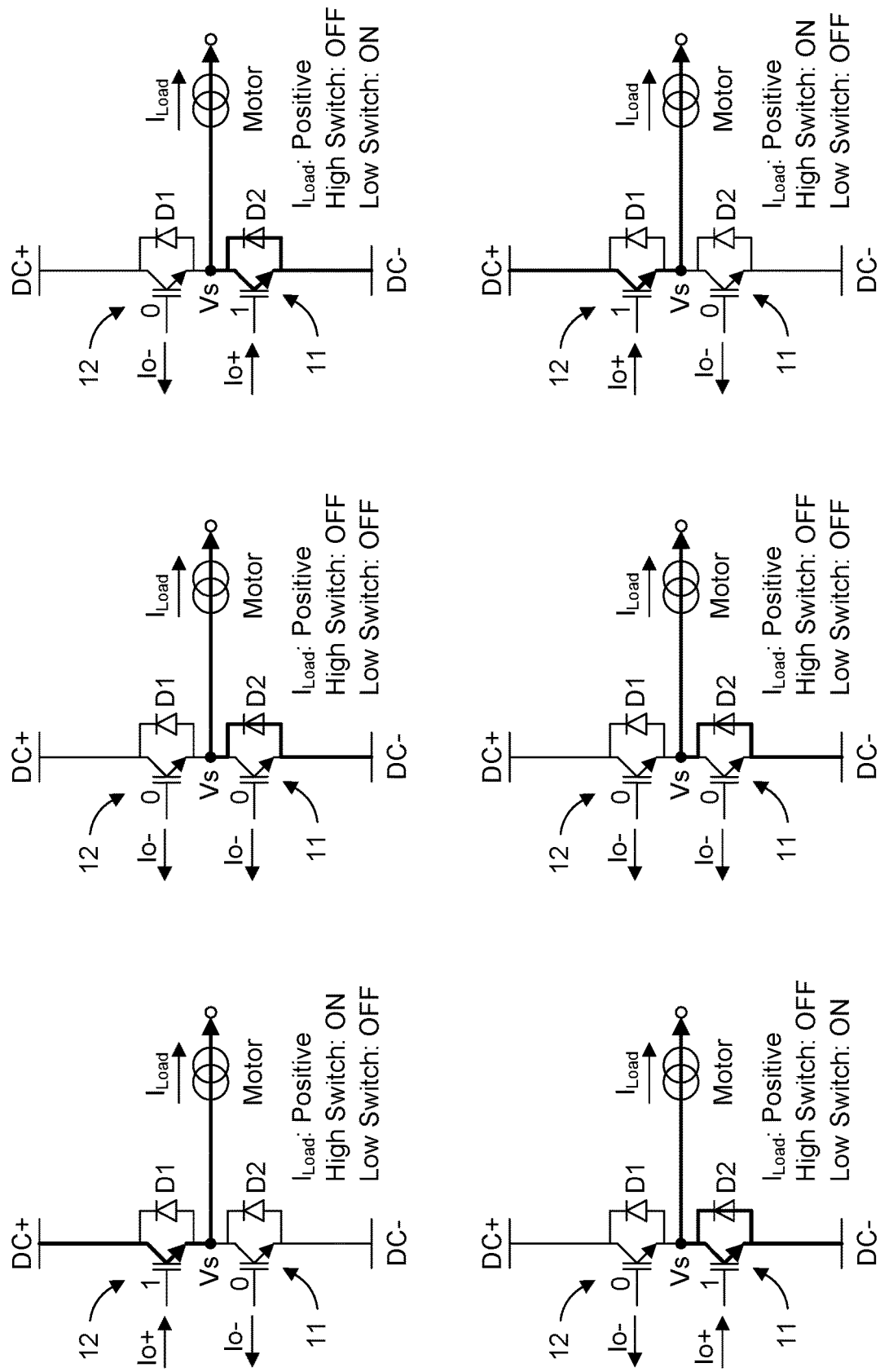
FIG. 9 shows a schematic of an inverter leg across multiple transitions during different switching events according to one or more embodiments.

FIG. 9 shows a schematic of an inverter leg across multiple transitions during different switching events according to one or more embodiments. In normal operation, the two power switching devices 11 and 12 of the inverter leg switch on and off one after the other. Since power switching devices are not ideal, turn on times and turn off times are not strictly identical. Having both devices conducting at the same time will result in bridge shoot-through. To avoid this, a dead time is added into the control scheme of the two power transistors 11 and 12. With this additional time, one switch will be always turned off first and the other will be turned on after the dead time has expired. Providing dead time can on one side avoid bridge shoot-through but on the other side it also has an adverse effect.

The load current can be positive (i.e., flowing from the half-bridge to the motor) or negative (i.e., flowing from the motor to the half-bridge). In both cases, there are three possible settings of the switches of the inverter-leg: high switch OFF and low switch OFF; high switch ON and low switch OFF; or high switch OFF and low switch ON.

Assuming first that load current is positive, the high switch 12 is switched from ON to OFF and the low switch 11 is switched from OFF to ON, as shown in the upper portion of FIG. 9, or the high switch 12 is switched from OFF to ON and the low switch 11 is switched from ON to OFF, as shown in the lower portion of FIG. 9. During the effective dead time, both devices are OFF and a freewheeling diode D2 of the low switch 11 is conducting output current that flows towards the motor.

Figure 10:
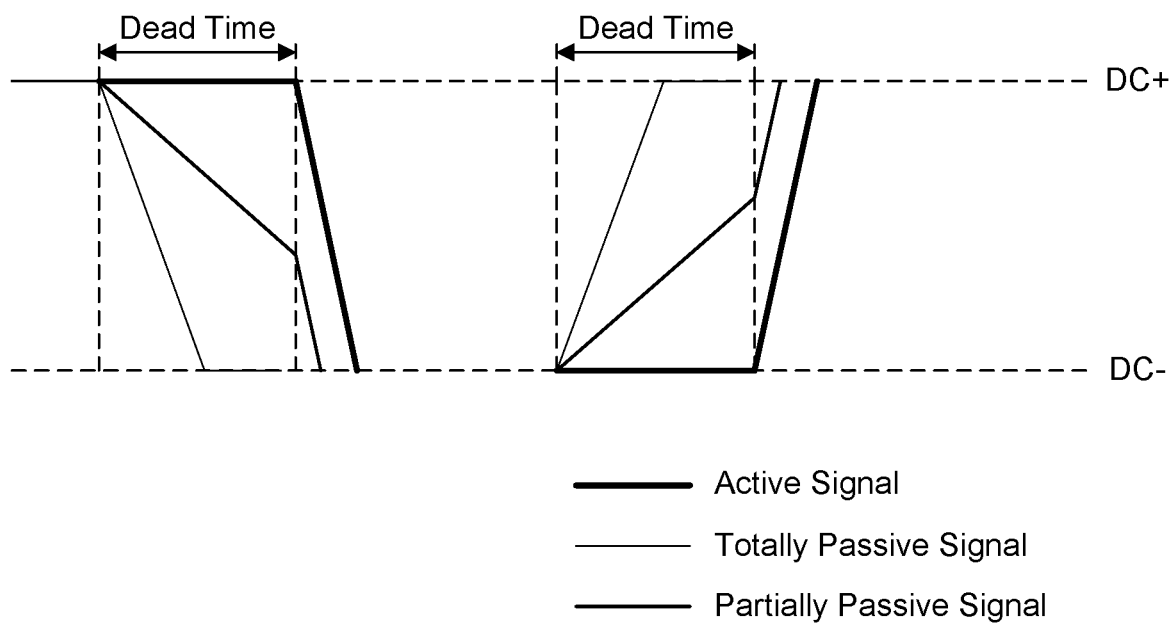
FIG. 10 shows two signal diagrams illustrating, on the left, negative totally passive, partially passive, and active signals, and illustrating, on the right, positive totally passive, partially passive, and active signals according to one or more embodiments.

There are three different types of negative dV/dt: totally passive, partially passive, and active. Similarly, there are three different types of positive dV/dt: totally passive, partially passive, and active. FIG. 10 shows two signal diagrams illustrating, on the left, negative totally passive, partially passive, and active signals, and illustrating, on the right, positive totally passive, partially passive, and active signals according to one or more embodiments.

For the active negative dV/dt, Vs remains at the high voltage of the DC link (i.e., DC+) for the entire dead time, and then falls to the low voltage of the DC link (i.e., DC−) following the dead time. Thus, for active negative dV/dt, the Vs slope is outside of the dead time. On the other hand, in totally passive negative dV/dt, the Vs slope is completely inside the dead time before the low side switch 11 is turned on. For partially passive negative dV/dt, the Vs slope is partially inside and partially outside the dead time. In addition, when a partially passive dV/dt happens, the output of the comparators of the dV/dt regulator may not be reliable in the valid window because the pulse on HVsense or LVsense node has a smaller duration. For example, the duration can be so short that the comparators do not trip at all and the two comparators are unable to distinguish this case from the case in which dV/dt is slower than the target range.

In this case, the negative active dV/dt is driven by switching ON of the low side switch 11 while partially passive dV/dt and totally passive dV/dt are driven by switching OFF of the high side switch 12.

In the other case, where the load current is negative, the low switch 11 is switched from ON to OFF and the high switch 12 is switched from OFF to ON. Here, the freewheeling diode D1 conducts the load current during the dead time. There are three different types of positive dV/dt: totally passive, partially passive, and active.

For the active positive dV/dt, Vs remains at the low voltage of the DC link (i.e., at DC−) for the entire dead time, and then rises to the high voltage of the DC link (i.e., DC+) following the dead time. Thus, for active positive dV/dt, the Vs slope is outside of the dead time. On the other hand, in totally passive positive dV/dt, the Vs slope is inside the dead time before the high side switch 12 is turned on. For partially passive positive dV/dt, the Vs slope is partially inside and partially outside the dead time. In addition, when a partially passive dV/dt happens, the output of the comparators of the dV/dt regulator may not be reliable in the valid window because the pulse on HVsense or LVsense node has a smaller duration. For example, the duration can be so short that the comparators do not trip at all and the two comparators are unable to distinguish this case from the case in which dV/dt is slower than the target range.

In this case, the positive active dV/dt is driven by switching ON of the high side switch 12. While partially passive dV/dt and totally passive dV/dt are driven by switching OFF of the low side switch 11.

Power switches are dimensioned to easily conduct a current higher than a maximum load current. Thus, when switching actively, the dV/dt slope is steeper. Vice versa, during a totally passive switching, dV/dt is slower (no EMI problems) but also energy in the power switches is not being dissipated because both are off. In partially passive switching, there is a first passive portion followed by a second active portion of the switching event. In the first passive portion, dV/dt behaves as it does during the totally passive switching (i.e., slower and without power dissipation in the switches). In the second active portion, dV/dt behaves as it does during the active switching. For the second active portion, current Io+ can be set according to a measurement taken during a previous active switching event. However, dV/dt is not measured during the second active portion of the partially passive switching because a wrong measurement due to short pulse duration can occur. Thus, dV/dt measurements during the second active portion can be unreliable.

The dV/dt regulators 31 and 32 are configured to determine a type of the negative dV/dt and the positive dV/dt, and regulate only active ones while ignoring passive ones. Specifically, the dV/dt regulators can verify that a dV/dt is an active one before allowing its register 80 to be updated. In order to implement this determination of dV/dt type, a third comparator is introduced in each dV/dt regulator 31 and 32.

Figure 11:
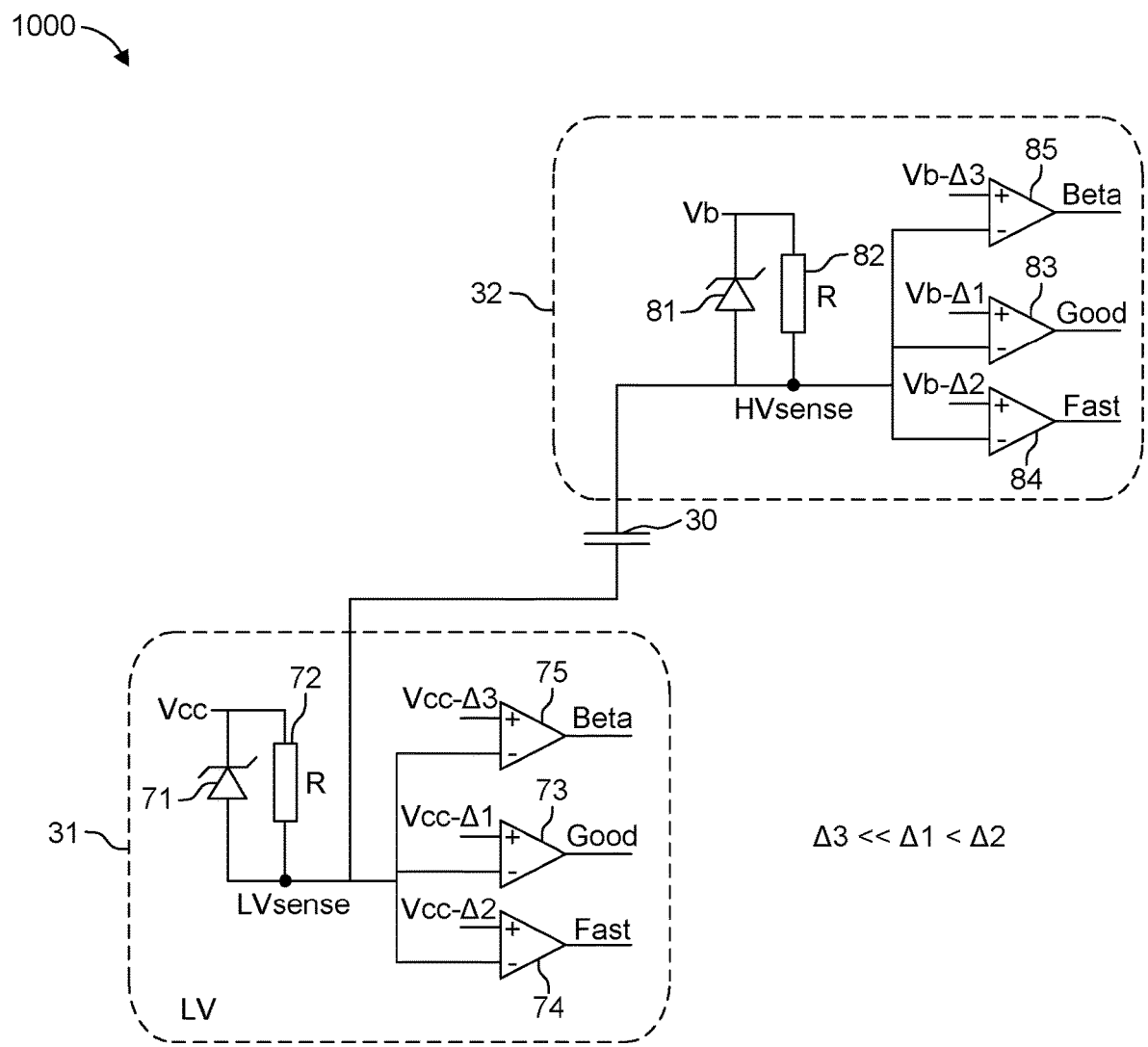
FIG. 11 is a schematic diagram of another dV/dt sensing circuit according to one or more embodiments.

FIG. 11 is a schematic diagram of a dV/dt sensing circuit 1000 according to one or more embodiments. In particular, the dV/dt sensing circuit 1000 is similar to the dV/dt sensing circuit 700 shown in FIG. 7 with the exception of additional, third, comparators 75 and 85 being added to the dV/dt regulators 31 and 32. The comparators 75 and 85 are used to verify that the dV/dt being measured is an active dV/dt.

As noted above, the sense nodes, LVsense and HVsense, detect the degree of the slope dV/dt. Similar to the other comparators, the third comparator 75, 85 reacts according to the voltage at the sense node with respect to its threshold voltage. The constant Δ3 is considerably lower than the other constants Δ1 and Δ2 (i.e., Δ3<<Δ1, Δ2) so that threshold level (i.e., reference voltage) at the input of the third comparator 75 or 85 is higher than the other threshold levels. In this way, the logic output of the third comparator is active on any "fast" dV/dt, including active and passive ones. However, due to the reduction in the slope during the slow tail portion of dV/dt, the third comparator is not active on the slow tail portion of dV/dt. That is, at the instant dV/dt changes from the "fast" portion to the "tail" portion, the voltage at the sense node reacts such that the voltage is greater than that threshold level of the third comparator 75, 85. This causes the output of the third comparator 75, 85 to switch (e.g., from 1 to 0), indicating that the "fast" portion of dV/dt has expired and that the "tail" portion of dV/dt has begun.

Figure 12:
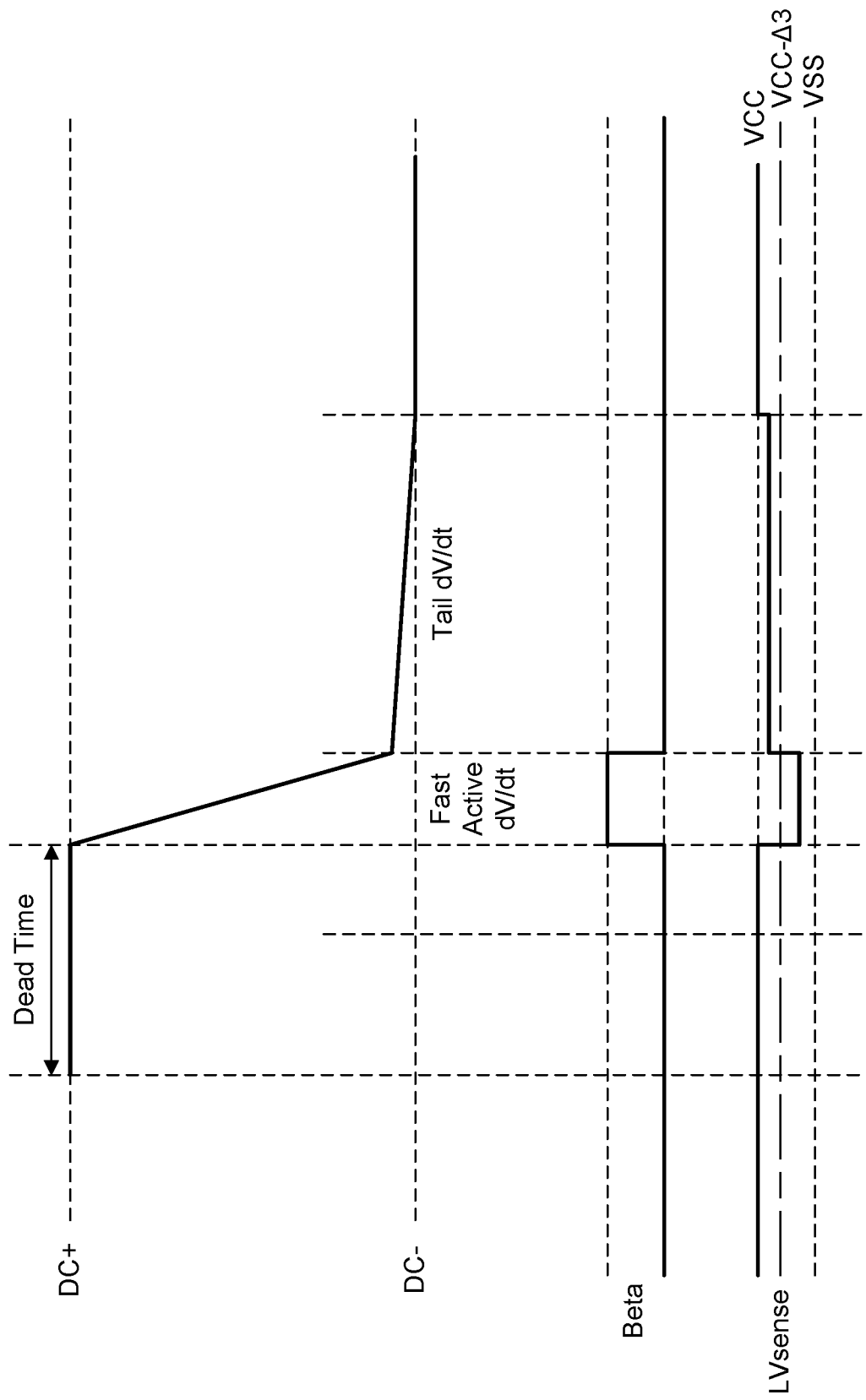
FIG. 12 is a signal diagram showing an output response for signal Beta of the third comparator based on a voltage at a sense node according to one or more embodiments.

FIG. 12 is a signal diagram showing an output response for signal Beta of the third comparator 75 based on the voltage at the LVsense node according to one or more embodiments. The voltage at the LVsense node is representative of the slope of dV/dt. The third comparator 85 behaves similarly based on the voltage at the HVsense node. As a result, the third comparators 75, 85, with an accurately selected threshold, can distinguish two families of slopes: (1) active and passive slopes on one side, and (2) tail slopes or steady state on the other.

For example, the tail can be 100 or even 1000 times slower than any type of fast dV/dt portion. Purely as an example, at the tail portion, dV/dt may be in the 1-5 V/microsecond range and is something radically different and is an order of magnitude lower from the fast portion where during passive dV/dt may be 500-3000 V/microsecond and active dV/dt may be 4500-5500 V/microsecond. Thus, the slow tail portion can be detected by the third comparator, for example, by switching its output from high (e.g., "1") to low (e.g., "0") in response to the voltage slope drastically decreasing in an order of magnitude with respect to any type of fast dV/dt. The order of magnitude may be 100 or more.

For example, the third comparator 75 receives a third reference voltage equal to Vcc−Δ3, where Δ3 is configurable. The output "Beta" of the third comparator 75 is active (e.g., "1") when the voltage at the LVsense node is less than the third reference voltage Vcc−Δ3, and is "0" otherwise. Since the third reference voltage is relatively close to Vcc, a drop from Vcc greater than Δ3 can be detected, indicating that the slope of fast dV/dt has started. The output "Beta" of the third comparator 75 is provided to the processing circuit, which applies the output, along with the output "Fast" and the output "Good", to an algorithm or rule set. The processing circuit then determines a result based on the algorithm, where the result may be to either update or maintain the register 80. The result may be output from the processing circuit in the form of instructions to the logic of the LV gate driver 21 to regulate the ON current Io+ provided to the power transistor 11.

Similarly, the third comparator 85 receives a third reference voltage equal to Vb−Δ3, where Δ3 is configurable. The output "Beta" of the third comparator 85 is active (e.g., "1") when the voltage at the HVsense node is less than the third reference voltage Vb−Δ3, and is "0" otherwise. Since the third reference voltage is relatively close to Vb, a drop from Vb greater than Δ3 can be detected, indicating that the slope of fast dV/dt has started. The output "Beta" of the third comparator 85 is provided to the processing circuit, which applies the output, along with the output "Fast" and the output "Good", to an algorithm or rule set. The processing circuit then determines a result based on the algorithm, where the result may be to either update or maintain the register 80. The result may be output from the processing circuit in the form of instructions to the logic of the HV gate driver 22 to regulate the ON current Io+ provided to the power transistor 12.

The algorithm of each gate driver 21 and 22 (i.e., each dV/dt regulator) can now distinguish between four different measurement cases.

In a first case, the "Good", "Fast", and "Beta" signals are all active. As a result it is determined that dV/dt is faster than the target range, and the register value of register 80 is decreased by 1 lowest significant bit (LSB).

In a second case, the "Good" and "Beta" signals are active but the "Fast" signal is not active. As a result, it is determined that dV/dt is inside the target range, and the register value of register 80 is maintained or kept unchanged.

In a third case, both the "Good" and "Fast" signals are not active, but the "Beta" signal is active. As a result, it is determined that dV/dt is slower than the target range, and the register value of register 80 is increased by 1 LSB.

Finally, in a fourth case, the "Good", "Fast", and "Beta" signals are all not active. Thus, no signal is active in the measurement window or the "Beta" signal is active before the turn on command to the power transistor. In this case, dV/dt is passive and the value of the register 80 is maintained or kept unchanged (i.e., the dV/dt regulator takes no action).

Furthermore, if the "Beta" signal is active before the validation windows (i.e., if the "Beta" signal is active during the dead time), it means that a total or partial passive dV/dt event has occurred. In this case, when the "Beta" signal is active during any portion of the dead time, the processing circuit of the dV/dt regulator is configured to ignore any data from the comparators for a predetermined duration and should not strobe data into the register 80. Thus, in case the "Beta" signal is active during the dead time before the active switching event, any new data is ignored by the processing circuit (e.g., no strobe into the register 80). In other words, the processing circuit of each dV/dt regulator 31 and 32 is configured to track the dead time and distinguish an active dV/dt event from a passive dV/dt event based on whether the "Beta" signal is active during any portion of the dead time or is active only after the dead time has expired. Thus, this effectively enables the dV/dt regulators 31 and 32 to ignore passive or partially passive dV/dt and only permits data to be strobed into the register 80 during an active switching event.

As noted above, the high sensitivity dV/dt sensing signal "Beta" can be used to detect the end of the fast portion of dV/dt and the start of the tail portion of dV/dt. Upon detecting this change in the signal "Beta", the processing circuit of the dV/dt regulator 31 or 32 may indicate to the gate driver that the active or passive switching event has expired. In response, the gate driver may fully turn on its respective power transistor 11 or 12 such that current Io+ is at a maximum for a second duration that includes a second interval of dV/dt. More specifically, the current remains at its maximum value from the end of the fast portion of dV/dt, through the tail portion of dV/dt, until the next switching event. This maximized current reduces the slow dV/dt tail typical of power devices shown in FIG. 1, since the dV/dt in the tail has an extremely low dV/dt. Thus, this correction of the slow tail dV/dt is performed in real time, in contrast to the correction of the fast dV/dt which is corrected in the next active switching event.

There may be another advantage in regulating the fast dV/dt with a precisely selected Io+ current and, after the fast dV/dt expires, using all the current available to fully turn on the power switch. This technique may help to keep the power switch itself fully on even in case of noise coupled being to its gate.

In view of the above, a dV/dt sensing circuit with a dV/dt regulator for each power transistor is configured to autonomously and dynamically adjust the dV/dt using one or more linear HV capacitors. The one or more HV capacitors are used by each dV/dt regulator to sense the voltage slope dV/dt of a driven power transistor to regulate the dV/dt of the same driven power transistor. The capacitor may be integrated on the gate driver chip and it is used to detect the type (active, passive, or partially passive) and speed (fast dV/dt or slow tail) of the voltage slope dV/dt and to consequently regulate: in the next active switching event adapting the Io+ current, and in the same switching event cutting the slow tail.

Using one or more HV capacitors for sensing (sampling by ADC or a directly with a linear circuit), the voltage slope dV/dt of a driven power transistor can be measured to regulate the dV/dt of the driven power transistor. The HV capacitor may be indirectly connected between the gate driver and the collector/drain of the driven power transistor. Indirectly being defined as through one or more decoupling capacitors in the system the driven power transistor is used in. This configuration gives the advantage that, in a half bridge or bridge leg, this omits one additional high-voltage pin in the driver package that needs isolation distance from all other pins.

Additionally, one or more capacitances connected between the low side and high side gate driver can be used to sense and regulate the switching dV/dt for both the low-side switch and the high-side switch independent of the regulation method is as described herein, regardless of whether ADCs with multiple samples and digital cycle to cycle regulation or a linear circuit regulation is used.

Normally, it is the collector-emitter voltage or the drain-source voltage of the two switches that should be regulated. It may be preferred that the feedback capacitance is connected from the collector or drain of the driven switch to the sense input of the gate driver (which is referenced to the emitter or source of the driven switch). However, in a half bridge configuration (e.g., a Buck or Boost configuration), if it is desirable to save a capacitor, a single HV capacitor 30 can be used as shown in FIGS. 3, 7, and 10. The reason this can be done is that from a small signal point of view the emitter or source of the low side switch is the same as the collector or drain of the high side switch.

Additionally, if it is preferred to use integrated capacitor/capacitors (either in the gate driver package in a system in package or on the gate driver die or dies in a System-on-Silicon) one may potentially end up with one more high voltage pins on the package that will require creepage distance from the other nodes/pins if the collector/drains are sensed directly with two separate capacitors. For a half bridge driver, the different voltage clusters are: input control signals together with the low side gate driver power supplies and outputs, the high side gate driver power supplies and outputs, and lastly the dV/dt sensing to the collector/drain of the high side switch. With only two signal clusters needing the creepage distance, two separate sides of a package, i.e. Dual Small Outline (DSO) type package, can be used and the distance is almost coming for free. With a third node, a lot of package space is used.

So the bottom line here is that the feature of dv/dt sensing and control can be fully integrated without adding any additional pins if the described configurations are used. For example, a monolithic solution having two separate voltage islands or a multi-die solution with galvanic isolation between the chips and three separate voltage islands can be used. Common for the two examples is that no additional voltage island needs to be added due to the dV/dt sensing being fully integrated.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Depending on certain implementation requirements, embodiments provided herein can be implemented in hardware or in software. The implementation can be performed using a digital storage medium, for example a floppy disk, a DVD, a Blue-Ray, a CD, a RAM, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A control unit including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes a computer program to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A gate driver circuit, comprising:
    a gate driver configured to generate an on-current during a plurality of turn-on switching events to drive a transistor, wherein a voltage across the transistor changes from a first value to a second value with a slope during the plurality of turn-on switching events, wherein the slope is of either an active type or a passive type, and wherein the slope of the active type is dependent on an amplitude of the on-current; and
    a sensing circuit configured to determine whether the slope during a first turn-on switching event is the active type or the passive type, and to regulate the amplitude of the on-current during a second turn-on switching event that is subsequent to the first turn-on switching event if the slope is the active type and to maintain the amplitude of the on-current as unchanged during the second turn-on switching event if the slope is the passive type.

2. The gate driver circuit of claim 1, wherein the sensing circuit is configured to measure the slope of the voltage during the first turn-on switching event, compare the measured slope to a target slope range to generate a comparison result, and regulate the on-current during the second turn-on switching event based on the comparison result such that the slope of the voltage during the second turn-on switching event is within the target slope range.

3. The gate driver circuit of claim 2, wherein, based on the comparison result, the sensing circuit is configured to:
    if the measured slope is greater than the target slope range, decrease the amplitude of the on-current for the second turn-on switching event;
    if the measured slope is within the target slope range, maintain the amplitude of the on-current as unchanged for the second turn-on switching event; and
    if the measured slope is less than the target slope range, increase the amplitude of the on-current for the second turn-on switching event.

4. The gate driver circuit of claim 1, further comprising:
    a high-side region that operates in a first voltage domain;
    a low-side region that operates in a second voltage domain lower than the first voltage domain; and
    a capacitor coupled to the high-side region and to the low-side region,
    wherein the sensing circuit is coupled to the capacitor for detecting and measuring the slope.

5. The gate driver circuit of claim 4, wherein the gate driver and the sensing circuit are disposed in the high-side region and the transistor is a high-side power transistor.

6. The gate driver circuit of claim 5, wherein the capacitor is coupled to an input node of the sensing circuit and to a ground voltage of the low-side region.

7. The gate driver circuit of claim 5, further comprising:
    a further gate driver disposed in the low-side region and configured to drive a low-side power transistor complementary to the high-side power transistor;
    a further sensing circuit disposed in the low-side region and configured to sense a voltage across the low-side power transistor that has a further slope that changes during turn-on of the low-side power transistor,
    wherein the capacitor is coupled to an input node of the sensing circuit and to an input node of the further sensing circuit.

8. The gate driver circuit of claim 4, wherein the gate driver and the sensing circuit are disposed in the low-side region and the transistor is a low-side power transistor.

9. The gate driver circuit of claim 8, wherein the capacitor is coupled to an input node of the sensing circuit and a floating ground voltage of the high-side region.

10. The gate driver circuit of claim 8, further comprising:
    a further gate driver disposed in the high-side region and configured to drive a high-side power transistor complementary to the low-side power transistor;
    a further sensing circuit disposed in the high-side region and configured to sense a voltage across the high-side power transistor that has a further slope that changes during turn-on of the high-side power transistor,
    wherein the capacitor is coupled to an input node of the sensing circuit and to an input node of the further sensing circuit.

11. The gate driver circuit of claim 1, wherein:
    the slope is the passive type if the slope occurs at least partially within a dead time of a switching cycle that includes the first turn-on switching event, and
    a slope is the active type if the slope occurs entirely after the dead time of the switching cycle.

12. The gate driver circuit of claim 1, wherein
    each turn-on switching event of the plurality of turn-on switching events comprises a first time interval and a second time interval after the first time interval, the slope includes an initial slope during the first time interval and a second slope during the second time interval, wherein the initial slope is greater than the second slope, and the sensing circuit is configured to determine whether the initial slope during the first turn-on switching event is the active type or the passive type, and to regulate the amplitude of the on-current during the second turn-on switching event if the initial slope during the first turn-on switching event is the active type and to maintain the amplitude of the on-current as unchanged during the second turn-on switching event if the initial slope during the first turn-on switching event is the passive type.

13. The gate driver circuit of claim 12, wherein the sensing circuit is configured to measure the initial slope of the voltage during the first turn-on switching event, compare the measured initial slope to the target slope range to generate the comparison result, and regulate the on-current during the second turn-on switching event based on the comparison result.

14. The gate driver circuit of claim 12, wherein the sensing circuit is configured to detect an expiration of the first time interval of the first turn-on switching event, and increase the on-current to a maximum value for at least a portion of the second time interval of the first turn-on switching event.

15. The gate driver circuit of claim 1, wherein the second turn-on switching event is a next turn-on switching event subsequent to the first turn-on switching event.

16. The gate driver circuit of claim 1, wherein the plurality of turn-on switching events are active, hard switching events during which the slope of the voltage takes place after the transistor has taken over a load current.

17. A gate driver circuit, comprising:
a gate driver configured to generate an on-current during a plurality of turn-on switching events to drive a transistor, wherein each turn-on switching event of the plurality of turn-on switching events comprises a first time interval and a second time interval subsequent to the first time interval, wherein, during the plurality of turn-on switching events, a voltage across the transistor changes from a first value to a second value with an initial slope during the first time interval and with a second slope during the second time interval, wherein the initial slope is greater than the second slope, wherein the initial slope starts during or after a dead time, wherein the initial slope is dependent on an amplitude of the on-current when starting with or after the dead time, and wherein the second slope is dependent on the amplitude of the on-current; and a sensing circuit configured to detect an expiration of the first time interval of a first turn-on switching event of the plurality of turn-on switching events, and increase the on-current to a maximum value for at least a portion of the second time interval of the first turn-on switching event in response to the detected expiration of the first time interval.

18. The gate driver circuit of claim 17, wherein:
the sensing circuit is configured to determine whether the initial slope during the first turn-on switching event is an active type or a passive type, and to regulate the amplitude of the on-current during a second turn-on switching event that is subsequent to the first turn-on switching event if the initial slope is the active type and to maintain the amplitude of the on-current as unchanged during the second turn-on switching event if the initial slope is the passive type.

19. The gate driver circuit of claim 18, wherein:
on a condition that the initial slope is the active type:
the sensing circuit is configured to measure the initial slope during the first turn-on switching event, compare the measured initial slope to a target slope range to generate a comparison result, and regulate the on-current during the second turn-on switching event based on the comparison result such that the initial slope of the voltage during the second turn-on switching event is within the target slope range.

20. The gate driver circuit of claim 19, wherein, based on the comparison result, the sensing circuit is configured to:
if the measured initial slope is greater than the target slope range, decrease the amplitude of the on-current for the second turn-on switching event;
if the measured initial slope is within the target slope range, maintain the amplitude of the on-current as unchanged for the second turn-on switching event; and
if the measured initial slope is less than the target slope range, increase the amplitude of the on-current for the second turn-on switching event.

21. A method of driving a transistor, comprising:
generating an on-current during a plurality of turn-on switching events to drive the transistor, wherein a voltage across the transistor changes from a first value to a second value with a slope during the plurality of turn-on switching events, wherein the slope is of either an active type or a passive type, and wherein the slope of the active type is dependent on an amplitude of the on-current; and determining whether the slope during a first turn-on switching event is the active type or the passive type; and regulating the amplitude of the on-current during a second turn-on switching event that is subsequent to the first turn-on switching event if the slope is the active type and to maintain the amplitude of the on-current as unchanged during the second turn-on switching event if the slope is the passive type.

22. A method of driving a transistor, comprising:
generating an on-current during a plurality of turn-on switching events to drive the transistor, wherein each turn-on switching event of the plurality of turn-on switching events comprises a first time interval and a second time interval subsequent to the first time interval, wherein, during the plurality of turn-on switching events, a voltage across the transistor changes from a first value to a second value with an initial slope during the first time interval and with a second slope during the second time interval, wherein the initial slope is greater than the second slope, wherein the initial slope starts during or after a dead time, wherein the initial slope is dependent on an amplitude of the on-current when starting with or after the dead time, and wherein the second slope is dependent on the amplitude of the on-current;

detecting an expiration of the first time interval of a first turn-on switching event of the plurality of turn-on switching events; and increasing the on-current to a maximum value for at least a portion of the second time interval of the first turn-on switching event in response to the detected expiration of the first time interval.

* * * * *